US012639488B2

(12) United States Patent     (10) Patent No.:   US 12,639,488 B2

Desai et al.          (45) Date of Patent:     May 26, 2026

(54) AUTONOMOUS VEHICLE SIMULATION AND CODE BUILD SCHEDULING

(71) Applicant: GM Cruise Holdings LLC, San Francisco, CA (US)

(72) Inventors: Amit Girish Desai, San Jose, CA (US); Michael Storm, San Francisco, CA (US); Ian Harrison Markowtiz, San Francisco, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 1095 days.

(21) Appl. No.: 17/559,885

(22) Filed: Dec. 22, 2021

(65) Prior Publication Data

US 2023/0195972 A1     Jun. 22, 2023

(51) Int. Cl.
| | |
|---|---|
| *G06F 30/20* | (2020.01) |
| *G06F 9/48* | (2006.01) |
| *G06F 30/27* | (2020.01) |
| *G06Q 10/0631* | (2023.01) |

(52) U.S. Cl.
CPC ............ *G06F 30/20* (2020.01); *G06F 9/4881* (2013.01); *G06F 30/27* (2020.01); *G06Q 10/06311* (2013.01)

(58) Field of Classification Search
None
See application file for complete search history.

(56) References Cited

U.S. PATENT DOCUMENTS

| | | | | |
|---|---|---|---|---|
| 9,736,699 B1* | 8/2017 | Rao | ...................... | H04W 76/16 |
| 9,898,333 B2* | 2/2018 | Park | ...................... | G06F 9/485 |
| 10,796,581 B2* | 10/2020 | Herbach | ................. | G06F 9/546 |
| 10,896,116 B1* | 1/2021 | Gabrovski | .......... | G06F 11/3616 |
| 11,379,539 B2* | 7/2022 | Kolobov | .............. | G06F 9/4881 |
| 11,681,983 B2* | 6/2023 | Leonardo | ............ | G06Q 10/087 705/28 |
| 11,853,146 B2* | 12/2023 | Lim | ........................ | G06F 9/485 |
| 12,073,244 B2* | 8/2024 | Guney | ................. | G06F 9/5027 |
| 12,091,001 B2 | 9/2024 | Chi-Johnston et al. | | |
| 12,443,176 B2* | 10/2025 | Inam | ..................... | G06F 9/5027 |
| 2001/0008998 A1* | 7/2001 | Tamaki | .................. | G06Q 10/10 705/7.13 |
| 2016/0210382 A1* | 7/2016 | Alaniz | .................. | G09B 9/048 |
| 2019/0130056 A1* | 5/2019 | Tascione | ................ | G06F 30/20 |
| 2019/0171895 A1* | 6/2019 | Wang | ................... | G05D 1/0246 |

(Continued)

*Primary Examiner* — Akash Saxena

(74) *Attorney, Agent, or Firm* — CANTOR COLBURN LLP

(57) ABSTRACT

Systems and methods for autonomous vehicle (AV) simulation and code build scheduling are provided. A method includes receiving a first task specification for a first task associated with a first AV simulation and/or a first AV code build, receiving, a second task specification for a second task associated with a second AV simulation and/or a second AV code build, and executing a portion of the first task concurrently with a portion of the second task based on the portion of the first task and the portion of the second task have different resource requirements. The portion of the first task is associated with one of an AV asset download, an AV code execution, or an AV artifact upload. The portion of the second task is associated with a different one of the AV asset download, the AV code execution, or the AV artifact upload.

17 Claims, 12 Drawing Sheets

(56) References Cited

U.S. PATENT DOCUMENTS

| | | | | |
|---|---|---|---|---|
| 2019/0303759 A1* | 10/2019 | Farabet | .................. | G06N 3/045 |
| 2021/0056838 A1* | 2/2021 | Hyodo | .................. | G08G 1/091 |
| 2021/0192949 A1* | 6/2021 | Shin | .................... | G08G 1/0967 |
| 2021/0229678 A1* | 7/2021 | Wang | .................. | G06F 16/9035 |
| 2022/0027193 A1 | 1/2022 | Guney et al. | | |
| 2023/0012710 A1 | 1/2023 | Amarnath et al. | | |
| 2023/0080379 A1* | 3/2023 | Rider | .................... | G06N 20/00 |
| | | | | 706/12 |
| 2023/0112004 A1* | 4/2023 | Hari | ................. | B60W 60/0015 |
| | | | | 701/23 |
| 2023/0195959 A1* | 6/2023 | Desai | ..................... | G06F 30/27 |
| | | | | 703/8 |
| 2023/0195972 A1* | 6/2023 | Desai | .................. | G06F 9/4887 |
| | | | | 703/8 |
| 2023/0289281 A1* | 9/2023 | Redford | .............. | G06F 11/3698 |
| 2024/0004779 A1* | 1/2024 | Benson | .............. | G06F 11/3698 |
| 2024/0104008 A1* | 3/2024 | Chen | .................... | B60W 50/08 |
| 2024/0272922 A1* | 8/2024 | Lu | ....................... | G06F 11/3423 |
| 2024/0272948 A1* | 8/2024 | Jayabalan | ............. | G06F 9/4887 |

* cited by examiner

300

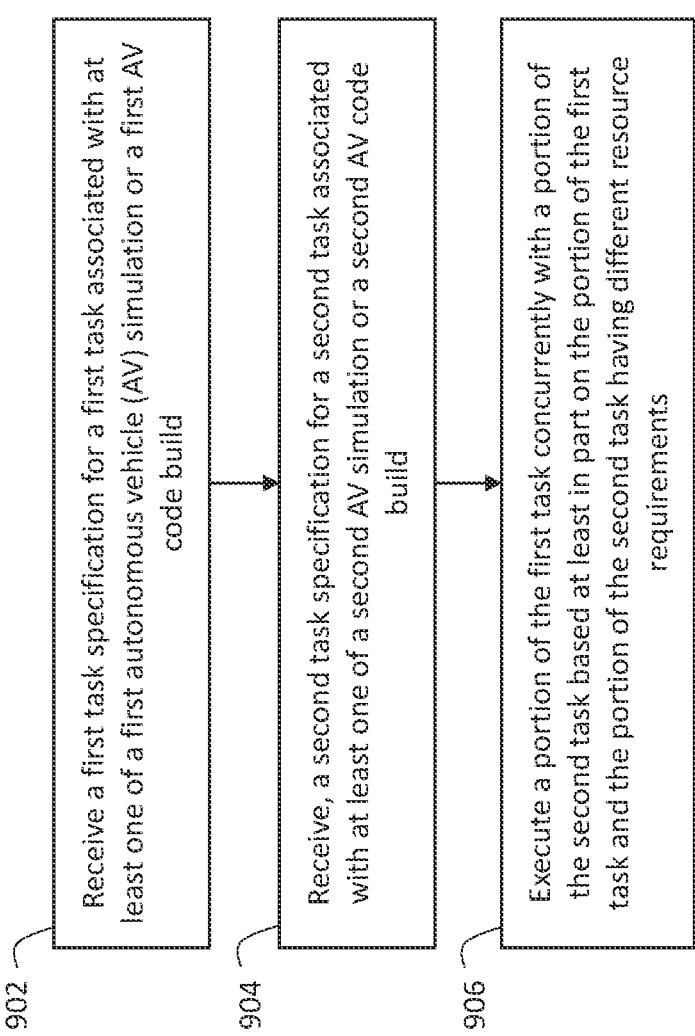

900

902 Receive a first task specification for a first task associated with at least one of a first autonomous vehicle (AV) simulation or a first AV code build 904 Receive, a second task specification for a second task associated with at least one of a second AV simulation or a second AV code build 906 Execute a portion of the first task concurrently with a portion of the second task based at least in part on the portion of the first task and the portion of the second task having different resource requirements

FIG. 9

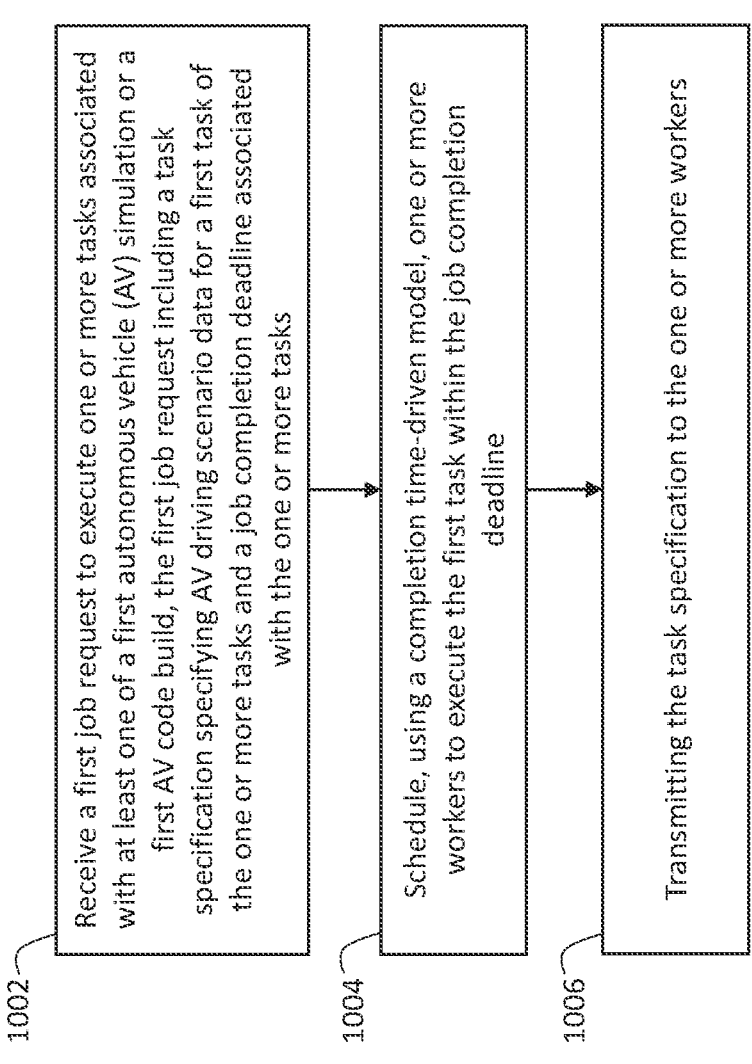

1002 — Receive a first job request to execute one or more tasks associated with at least one of a first autonomous vehicle (AV) simulation or a first AV code build, the first job request including a task specification specifying AV driving scenario data for a first task of the one or more tasks and a job completion deadline associated with the one or more tasks 1004 — Schedule, using a completion time-driven model, one or more workers to execute the first task within the job completion deadline 1006 — Transmitting the task specification to the one or more workers

AUTONOMOUS VEHICLE SIMULATION AND CODE BUILD SCHEDULING

TECHNICAL FIELD

The present disclosure relates generally to autonomous vehicles, and more particularly, to autonomous vehicle (AV) simulation and code build scheduling.

BACKGROUND

Autonomous vehicles, also known as self-driving cars, driverless vehicles, and robotic vehicles, may be vehicles that use multiple sensors to sense the environment and move without human input. Automation technology in the autonomous vehicles may enable the vehicles to drive on roadways and to accurately and quickly perceive the vehicle's environment, including obstacles, signs, and traffic lights. Autonomous technology may utilize map data that can include geographical information and semantic objects (such as parking spots, lane boundaries, intersections, crosswalks, stop signs, traffic lights) for facilitating driving safety. The vehicles can be used to pick up passengers and drive the passengers to selected destinations. The vehicles can also be used to pick up packages and/or other goods and deliver the packages and/or goods to selected destinations.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 9 is a flow diagram illustrating a scheduling process for AV simulation and/or AV code build, according to some embodiments of the present disclosure;

FIG. 10 is a flow diagram illustrating a scheduling process for AV simulation and/or AV code build, according to some embodiments of the present disclosure;

DETAILED DESCRIPTION

Overview

Figure 1:
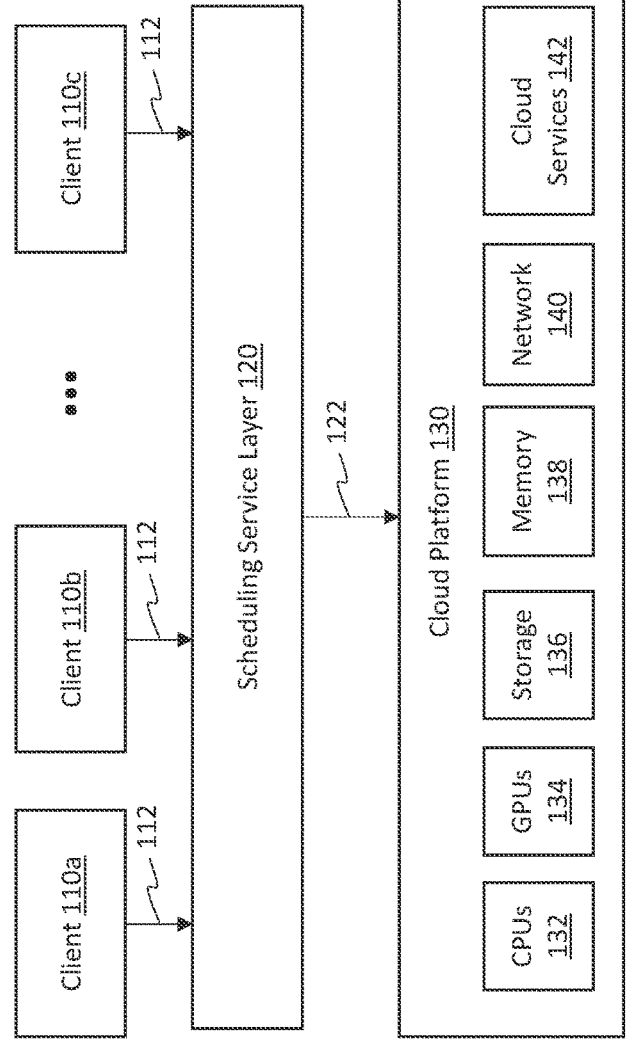
FIG. 1 is a block diagram illustrating an infrastructure framework for autonomous vehicle (AV) simulation and/or AV code build, according to embodiments of the present disclosure.

The systems, methods, and devices of this disclosure have several innovative aspects, no one of which is solely responsible for the attributes disclosed herein. Details of one or more implementations of the subject matter described in this specification are set forth in the description below and the accompanying drawings.

Autonomous vehicles (AVs) can provide many benefits. For instance, autonomous vehicles may have the potential to transform urban living by offering opportunities for safe, efficient, accessible, and affordable transportation. However, training and testing autonomous vehicles in the physical world can be challenging. For instance, to provide good testing coverage, an autonomous vehicle may be trained and tested to respond to various driving scenarios (e.g., millions of physical road test scenarios) before it can be deployed in a real-life roadway system. As such, it may be costly and time-consuming to train and test autonomous vehicles on physical roads. Furthermore, there may be test cases that are difficult to create or too dangerous to cover in the physical world. Accordingly, it may be desirable to train and validate autonomous vehicles in a simulation environment, covering at least a majority of the test scenarios. In this way, the number of physical road tests can be reduced while still providing good test coverage. Further, autonomous driving algorithms can be developed, fine-tuned, and tested with a shorter turn-around time on a simulation platform than it would have been with physical road tests.

While AV simulation can allow for validation of AV behaviors with newly developed autonomous driving algorithms across a large number of driving scenarios before deploying those algorithms in a real-life roadway system, providing an infrastructure that can support a large number of simulation runs on a daily basis can be challenging. Further, an infrastructure platform may be used not only to provision for AV simulation runs, but also for subsequent stages of AV code development and release integration. For instance, after an algorithm is validated through simulation, the validated algorithm may be integrated and compiled into an AV code build (e.g., software or firmware) and the integrated code build may be further tested. For instance, a set of test cases covering various driving scenarios may be defined and the AV code build may be tested against these test cases. After successfully testing the integrated code build, the integrated code build may be compiled into an AV code release and the AV code release may be further tested (e.g., against the same set of test cases or a different or more extensive set of test cases) before the AV code release is deployed in AVs for real-road testing and real-road driving. As such, the number of AV simulation and/or AV code build runs on the infrastructure platform may reach hundreds of thousands per day. Furthermore, the number of AV simulation and/or AV code build runs may continue to grow as more driving scenarios are identified and/or generated and/or more advanced algorithms are being developed, released, and deployed.

In some examples, an infrastructure platform may be built on top of a cloud platform that provides various resources, such as compute resources (e.g., central processing unit (CPU) cores and graphical processing unit (GPU) cores), memory resources, storage resources, and/or network resources, for running AV simulations and/or AV code builds. In an example, the cloud platform may include a shared pool of configurable resources and may present its resources to a cloud user (e.g., the infrastructure platform) in the form of workers. To that end, a worker may be configured with a specific computational capacity (e.g., 12 CPU cores and 12 GPU core, 12 CPU cores with no GPU core, etc.), a specific storage capacity (e.g., 128 gigabytes (GB) of disk storage, 256 GB of disk storage, etc.), a specific memory capacity (e.g., 16 GB of random access memory (RAM), 32 GB of RAM, etc.), and/or a specific network capacity (e.g., an uplink bandwidth or throughput and/or a downlink bandwidth or throughput). The cloud platform may be provided by a third-party provider, and each unit of resources or each worker may have an associated cost. To support a large number of AV simulation and/or code build runs on the infrastructure platform, the cost for the cloud platform can be high and may increase as the demand continues to grow. Further, different types of workers (e.g., committed workers that are already paid for irrespective of being used or not, on-demand workers, and/or preemptible workers) or workers with different computational, memory, and/or storage capacities may have different costs. Accordingly, it may be desirable for an infrastructure platform to efficiently schedule resources for AV simulation and/or code build so that the infrastructure cost can be kept at a minimum while meeting the demands of the AV simulation and/or AV code build runs.

The present disclosure describes mechanisms for an infrastructure system to efficiently schedule resources for AV simulation and/or code build jobs by using a completion goal-based scheduling model with machine learning (ML) and/or resource-aware pipeline scheduling. The infrastructure system may utilize a cloud platform with resources, such as CPUs, GPUs, memory, disk spaces, and/or network resources, to provision for the AV simulation and/or code build jobs. As used herein, a job may refer to a collection of tasks. Further, the terms "worker", "worker instance", "virtual machine (VM)", and/or "VM instance" may be used interchangeably and may generally refer to a set of resources, for example, providing a certain compute resource capacity (e.g., a quantity of CPU cores and/or a number GPU cores), a certain memory capacity, a certain storage capacity, and/or a certain network capacity (e.g., bandwidths and/or throughputs). Further, an AV code build can include compiling AV software and/or firmware source codes, running test cases (e.g., covering certain AV driving scenarios), and/or generating AV production software and/or firmware packages for deployment in AVs.

One aspect of the present disclosure may include a computer-implemented system (e.g., one or more servers) receiving a first job request to execute one or more tasks associated with at least one of a first AV simulation or a first AV code build. The first job request may include a task specification specifying one or more AV driving scenario data for a first task of the one or more tasks. More specifically, the task specification may specify information for downloading the AV driving scenario data. The AV driving scenario data can include at least one of objects (e.g., models of real-world objects based on collected sensor data) associated with a driving scenario or ground truth data associated with an ML model trained for the driving scenario. Further, the task specification may specify information for uploading AV artifacts for the first task. The AV artifacts can include at least one of a driving score, a simulation log or code run log, or an ML model prediction generated by the first task. Still further, the task specification may specify information for downloading an executable image (e.g., a simulation or compiled source codes) that may utilize the AV driving scenario data and output the AV artifacts. The first job request may further include a job completion deadline (e.g., a timestamp) associated with the one or more tasks. The job completion deadline may be the latest time or the target time by which the one or more tasks (e.g., all tasks in a requested job) are to be completed. In some instances, the job completion deadline may be an AV-specific completion deadline that may correspond to one of a plurality of levels associated with AV production criticality.

Because different AV simulation and/or code build jobs can have different completion deadlines (e.g., target completion times), the system may utilize a completion time-driven scheduling model to schedule one or more workers to execute the first task within the job completion deadline. The system may instruct the one or more workers to execute the first task by transmitting the task specification to the one or more workers. In a similar way, the system may utilize the completion time-driven scheduling model to schedule each of the other tasks onto one or more workers (e.g., overlapping or non-overlapping with the one or more workers scheduled with the first task) so that each task may be completed within the job completion deadline.

In some aspects, the completion time-driven scheduling model may include a task runtime model (e.g., an ML model) trained on previous task runtime data (e.g., task runtime log, task statistics, etc. from previous runs). For instance, the task runtime model may be trained based on task runtime data associated with at least one of a second AV simulation or a second AV code build (e.g., from a previous day) different from the at least one of the first AV simulation or the first AV code build. Accordingly, as part of the scheduling, the system may calculate or predict an estimated runtime for the first task using the task runtime model and based on the task specification for the first task. In some aspects, the system may further update the task runtime model, for example, periodically based on new task runtime data to refine the accuracy of the task runtime model. For instance, the system may receive, from the one or more workers, a completion indication for the first task. The system may determine a runtime (e.g., the amount of time for executing the first task) for the first task based on the completion indication and update the task runtime model based on the task specification and the runtime for the first task.

In some aspects, the system may bin-pack tasks from multiple jobs (e.g., concurrent jobs) onto a set of workers to optimize resource utilization while meeting the completion deadline for each of the job. For instance, the system may further receive a second job request to execute at least a second task associated with at least one of a second AV simulation or a second AV code build. The second job request may include a task specification for the second task and a job completion deadline associated with the second task. As part of the scheduling, the system may schedule, using the completion time-driven scheduling model, a first worker of the one or more workers to execute the second task before at least the first task based on the job completion deadline associated with the second task being earlier than the job completion deadline associated with the first task.

In some aspects, the system may utilize a combination of non-preemptible workers and preemptible workers to execute AV simulation and/or AV code build jobs. The non-preemptible workers may include committed usage workers (e.g., already purchased at a certain cost and created for use by the system), which may also be referred to as committed workers, and on-demand workers that can be launched (or "spin up") at a small additional cost. The preemptible workers can also be launched on-demand but may have a lower cost than the on-demand workers and can be preempted (or taken away) at some point of time, and thus a task scheduled on a preemptible worker may have the risk of not running to completion and having to be rerun on another worker. To balance the cost and the risk of using preemptible workers, the system may determine whether to schedule a preemptible worker or a non-preemptible worker to execute the first task based on various factors such as a runtime for the first task, a remaining time to the completion deadline for the first task, a threshold number of allowable preemptible workers (which may be referred to as a maximum usage), a threshold number of committed non-preemptible workers (which may be referred to as a minimum usage), a threshold number of allowable non-preemptible workers (which may be referred to as a preemptible quota), a total number of queued tasks including the first task, and/or an expected number of workers to execute the queued tasks (which may be referred to as a standard fit). Because a preemptible worker can be taken away at some point of time, in some aspects, the system may schedule the preemptible worker to execute the first task in response to the determination and may further schedule the non-preemptible worker to execute the first task in response to failing to complete the first task on the preemptible worker (due to the preemptible worker being preempted).

In some aspects, different workers may have different resource capacities, for example, at least one of different compute capacities, different memory capacities, different storage capacities, or different network capacities. The system may determine a suitable worker to execute a requested task. In some instances, the system may select a worker that has resource capacities (e.g., compute, memory, storage, and/or network capacities) matched to resource requirements of the task. However, in other instances, it may be desirable for the system to schedule the task on an available or free committed worker having resource capacities higher than the resource requirements of the task rather than on an on-demand worker having resource capacities matched to the task resource requirements since the committed worker is already paid for (e.g., at a discounted cost). For instance, the system may schedule a first worker of the one or more workers to execute the first task based on an availability of the first worker, irrespective of the first work having a higher resource capacity (or more resources) than a resource requirement of the first task.

In a further aspect of the present disclosure, an AV simulation or code build task can be partitioned into multiple stages, for example, beginning with an AV asset downloading stage, followed by an AV code execution stage and a subsequent AV artifact uploading stage. The system may have knowledge that the different stages may have different resource requirements, and thus may optimize resource utilization by applying pipeline scheduling to schedule a worker to concurrently execute multiple tasks. For instance, the system may receive a first task specification for a first task associated with at least one of a first AV simulation or a first AV code build. The system may further receive, a second task specification for a second task associated with at least one of a second AV simulation or a second AV code build. The system may schedule a worker to perform a portion of the first task concurrently with a portion of the second task based on the portion of the first task and the portion of the second task have different resource requirements. The portion of the first task is associated with one of an AV asset download, an AV code execution, or an AV artifact upload, and the portion of the second task is associated with a different one of the AV asset download, the AV code execution, or the AV artifact upload.

In some aspects, the portion of the first task executed concurrently with the portion of the second task may be associated with the AV asset download, and the portion of the second task may be associated with the AV artifact upload. In some aspects, the scheduling of the portion of the first task to be executed concurrently with the portion of the second task is further based on the portion of the first task and the portion of the second task having at least one of different compute resource requirements, different memory resource requirements, different storage resource requirements, different network resource requirements.

The systems, schemes, and mechanisms described herein can provide several benefits. For example, utilizing an ML model to estimate task runtime based on previous task runtime data and updating the ML model periodically with new runtime data can advantageously allow the ML model to automatically adjust and refine task runtime estimation accuracy, and thus can improve resource utilization, reducing infrastructure cost and speeding up job completion time. Additionally, partitioning an AV simulation and/or code build task into multiple stages and recognizing different resource requirements for the different stages can advantageously allow for a worker to execute multiple tasks in parallel, and thus can again improve resource utilization, reducing infrastructure cost and speeding up job completion time. Further, utilizing a job completion time-driven scheduling model can allow AV simulation and/or code build jobs that are more critical (e.g., with respect to an AV production) to be prioritized for scheduling rather than using standard task priorities defined for an individual task.

Example Infrastructure Framework for AV Simulation, Build, and Release

FIG. 1 is a block diagram illustrating an infrastructure framework 100 for AV simulation and/or AV code build, according to embodiments of the present disclosure. The infrastructure framework 100 may include a plurality of clients 110 (shown as 110a, 110b, . . . , 110c), a scheduling service layer 120, and a cloud platform 130. The cloud platform 130 may include a shared pool of configurable resources including CPU cores 132, GPU cores 134, storage resources 136 (e.g., disk space), memory 138 (e.g., RAMs), and/or network resources 140 (e.g., an uplink bandwidth, a downlink bandwidth, an uplink throughput, and/or a downlink throughput). The cloud platform 130 may also provide various cloud services 142 (e.g., databases hosting services, monitoring services, reporting services, query services, and/or container registry services, etc.) to assist scheduling and/or resource management. In some aspects, a provider of the cloud platform 130 may host the various resources and/or services at network data centers that are distributed in various geographical locations (e.g., at a west region of United States, an east region of United States, etc.). At a high level, the plurality of clients 110 (or client applications) may request the scheduling service layer 120 to execute certain AV simulation and/or code build jobs, and in response, the scheduling service layer 120 may schedule resources on the cloud platform 130 for execution of the requested jobs. Stated differently, the scheduling service layer 120 may operate as an abstraction layer to hide the underlying cloud platform 130 from the clients 110 so that the cloud platform 130 may be transparent to the clients 110.

The plurality of clients 110 may include AV simulation developers, AV software engineers, AV release and/or quality assurance (QA) engineers, etc. The clients 110 may submit job requests 112 to the scheduling service layer 120, for example, via scheduling service application interface (API) calls. Each job may include a collection of one or more tasks associated with an AV simulation or an AV code build (e.g., including implementation of sensing algorithms, ML models to identify objects in a driving scenario, ML models to facilitate autonomous driving, etc.). For instance, an AV simulation developer may submit a job for an AV simulation, an AV software engineer may submit a job for an AV code build under development or integration, and an AV release and/or QA engineer may submit a job for an AV code build in preparation for a release. In some aspects, the job request 112 may include a task specification specifying information (e.g., file information for AV driving scenario data or models, file information for processed AV artifacts for executing each task and/or an associated job completion deadline as will be discussed more fully below with reference to FIGS. 4 and 5.

An AV simulation job may include various tasks related to execution of various AV simulations and/or analysis of the simulation outputs. An AV code build job may include compilation of various AV software and/or firmware builds, associated testing, and/or generation of software and/or firmware release packages (e.g., to be deployed in AVs similar to the AV 10 shown in FIG. 11). As an example, a task may run a simulation that performs object identification in a certain driving scenario using an ML model. As another example, a task may run a simulation that simulates a certain sensor system and performs a certain sensing algorithm using the sensor system. As yet another example, a task may run an AV code (e.g., firmware or software) implemented based on a certain AV simulation. As yet another example, a task may compile a certain AV software or firmware build and run the compiled code over certain driving test scenarios. In general, a task may be associated with any stages within an AV code release life cycle (from simulation to code release). In some aspects, tasks within a job can be dependent on one another. As an example, an AV simulation job may include a first task to execute a simulation that simulates a certain sensor algorithm and/or system and generates sensor data using the sensor algorithm and/or system, and a second task to execute a simulation that performs object identification from sensor data generated from the first task. As another example, an AV code release job may include a first task to compile source codes of a certain software or firmware and a plurality of tasks to test the software or firmware under various driving scenarios.

The cloud platform 130 may present its resources (e.g., the CPU cores 132, GPU cores 134, the storage resources 136, and/or memory 138) to the scheduling service layer 120 in the form of workers or worker instances. As an example, a worker may include 12 CPU cores 132, 4 GPU cores 134, 350 GB of storage resources 136 (e.g., disk space), and 64 GB of memory 138. As another example, a worker may include 4 CPU cores 132, 100 GB of storage resources 136, 32 GB of memory 138, and no GPU cores 134. In general, the cloud platform 130 may provision for any suitable number of workers with any suitable configuration or combination of resources.

Upon receiving a job request 112 from a client 110, the scheduling service layer 120 may schedule resources (e.g., workers) on the cloud platform 130 to execute task(s) requested by the job request 112. To that end, the scheduling service layer 120 may utilize a completion time-driven scheduling model to schedule worker(s) to execute the tasks as will be discussed more fully below with reference to FIGS. 4-8. Subsequently, the scheduling service layer 120 may transmit a request 122 to the cloud platform 130 to schedule available worker(s) or launch ("spin up") additional worker(s) to execute the tasks, for example, via remote procedure calls (RPCs). In some aspects, the scheduling service layer 120 may spin up a worker by executing a VM image on the cloud platform 130, and then download a separate binary task image (e.g., an executable image) to the worker for execution. In any case, the scheduling service layer 120 may be responsible for creating VM images (including scheduling within the VM), requesting the cloud platform 130 to launch or spin up certain workers, and assigning AV simulation and/or code build jobs to the workers. While not shown, in some aspects, the scheduling service layer 120 may also utilize or access map services to facilitate the execution of an AV simulation or code build job.

Figure 2:
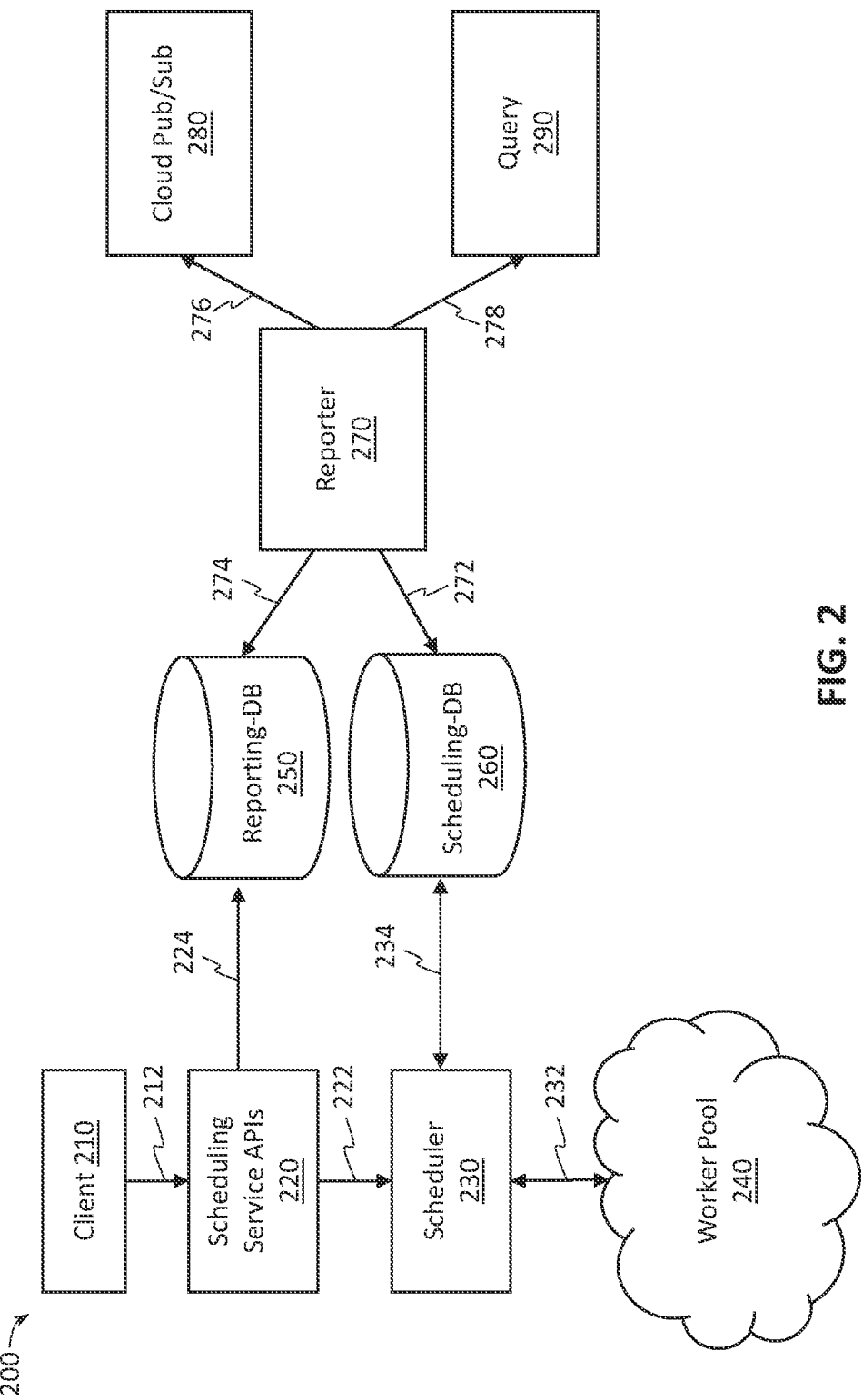
FIG. 2 is a block diagram illustrating an architecture of an infrastructure system for AV simulation and/or AV code build, according to embodiments of the present disclosure.

FIG. 2 is a block diagram illustrating an architecture of an infrastructure system 200 for AV simulation and/or AV code build, according to embodiments of the present disclosure. As shown, the system 200 may include various components including but not limited to, a client 210, a scheduling service APIs component 220, a scheduler 230, a worker pool 240, a reporting-database (DB) 250, a scheduling-DB 260, a reporter component 270, a cloud publisher/subscriber (Pub/Sub) component 280, and a query component 290. Each of the components may be implemented by a combination of hardware and/or software components, for example, as computer executable code executing on computer system(s) or server(s) (e.g., a cluster of network nodes). For simplicity, FIG. 2 illustrates one client 210. However, the system 200 can support any suitable number of clients 210 (e.g., about 2, 10, 100, 200, 500, 1000 or more).

The system 200 may be in many respects consistent with the framework 100 and may provide additional detail. For instance, the client 210 may correspond to the client 110. The scheduler 230 may be part of the scheduling service layer 120. The worker pool 240 may correspond to the CPU cores 132, the GPU cores 134, the storage resources 136, and the memory 138 provided by the cloud platform 130. The reporting-DB 250, the scheduling-DB 260, the reporter component 270, the cloud Pub/Subcomponent 280, and the query component 290 may be part of the cloud services 142 provided by the cloud platform 130.

At a high level, the client 210 may communicate with the scheduler 230 via the scheduling service APIs component 220, for example, to request execution of an AV simulation or code build job. The AV simulation or code build job may include a set of tasks as discussed above. In response, the scheduler 230 may schedule one or more workers from the worker pool 240 to execute the requested tasks. The scheduling service APIs component 220, the scheduler 230, the reporting-DB 250, the scheduling-DB 260, the reporter component 270, the cloud Pub/Sub component 280, and the query component 290 may also communicate with each other to maintain, track, and report scheduling statuses associated with the workers.

The scheduling service APIs component 220 may include a set of APIs. The set of APIs may include APIs for communication between the client 210 and the scheduler 230. For instance, the APIs may include a job request API call for requesting an AV simulation or code build job to be executed. The AV simulation or code build job may include a set of tasks. In some aspects, the job request API call can include input parameter(s) referencing a task specification for each task in the job. The set of APIs may also include APIs for communication between a user interface (UI) (e.g., an application for monitoring scheduling services) and the reporting-DB 250 to provide statuses related to the scheduling services.

The scheduler 230 may be a service including one or more processes configured to manage job states, schedule or assign jobs to workers in the worker pool 240, and communicate with the workers. The worker pool 240 may be a shared pool of configurable resources that form workers as will be discussed more fully below with reference to FIG. 3.

The scheduling-DB 260 may be a database configured to hold active dataset (e.g., job description and events related to active jobs). The reporting-DB 250 may be a database configured to hold historical data, for example, used for API queries. The reporter component 270 may include one or more processes configured to replicate events from the scheduling-DB 260 to the reporting-DB 250, the cloud Pub/Sub component 280, and/or the query component 290. The query component 290 may be a repository configured to facilitate batch queries associated with the reporting-DB 250 and/or the scheduling-DB 260. The cloud Pub/Sub component 280 may be configured to facilitate asynchronous messaging between the different components in the system 200.

As an example, at 212, the client 210 may call the scheduling service APIs components 220 to submit an AV simulation or code build job, for example, by calling a job request API. At 222, the job request API is sent to the scheduler 230. At 232, the scheduler 230 may schedule and assign the job to one or more workers in the worker pool 240. In some instances, the scheduler 230 may also receive updates of task and/or job statuses from the one or more workers, for example, when a task or a job is completed. At 234, the scheduler 230 may write a job event (e.g., indicating the assigned job) to the scheduling-DB 260. In some instances, the scheduler 230 may also read an event from the scheduling-DB 260. At 272, the reporter component 270 may read an event (e.g., associated with the assigned job) from the scheduling-DB 260. At 274, the reporter component 270 may update the reporting-DB 250, for example, by writing an event (e.g., indicating the assigned job read at 272) to the reporting-DB 250. At 276, the reporter component 270 may replicate the event to the cloud Pub/Sub component 280 (e.g., to publish the event). In this way, a subscriber that subscribes or registers to listen to the event may read the event. At 278, the reporter component 270 may also replicate the event to the query component 290. In this way, the query component 290 may facilitate other components in querying events associated with the reporting-DB 250. In a similar way, when a job or a task is completed, the scheduler 230 may write an event to the scheduling-DB 260, and the reporter component 270 may read the event from the scheduling-DB 260, update the reporting-DB 250, and replicate the event to the cloud Sub/Pub component 280 and/or the query component 290.

Figure 3:
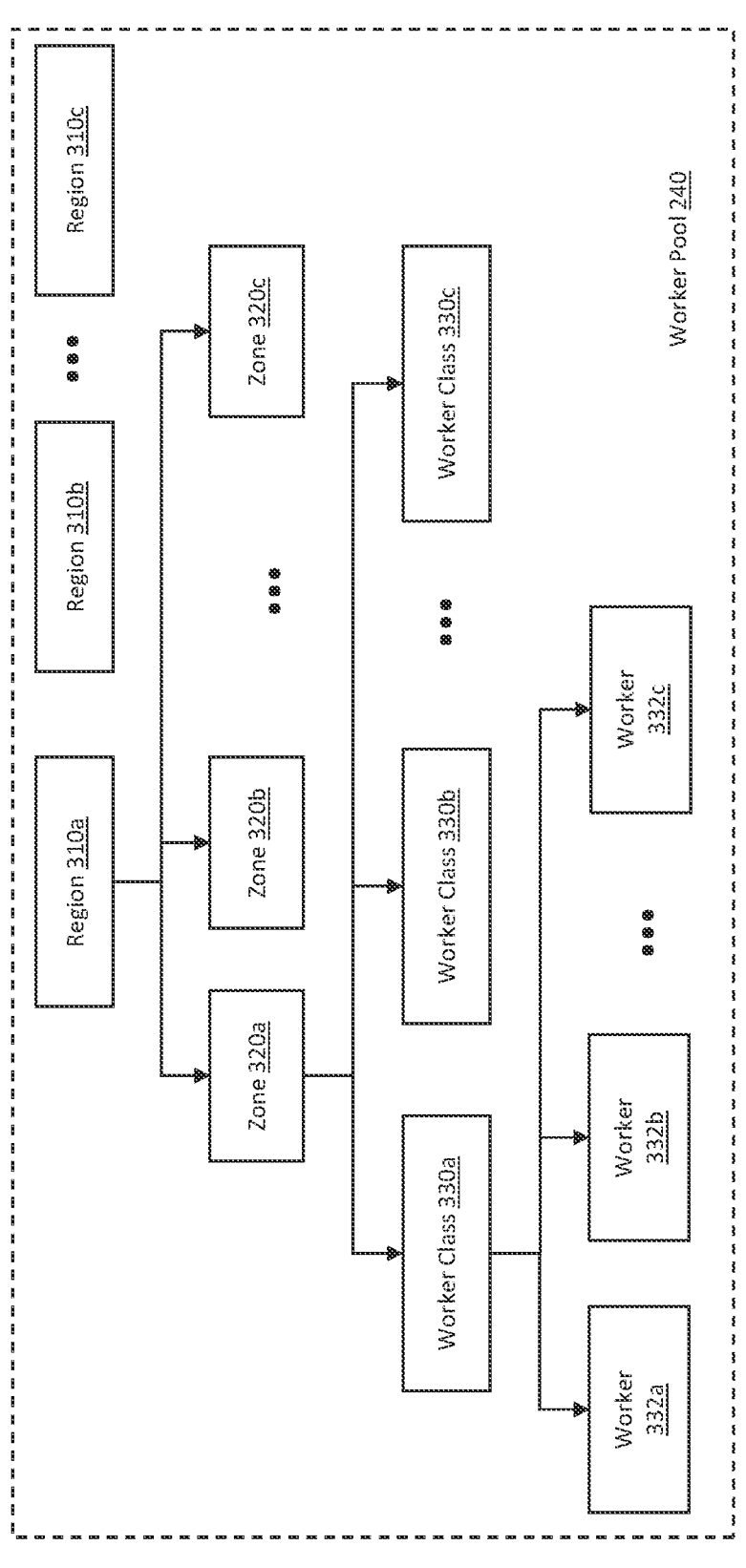
FIG. 3 is a block diagram illustrating an exemplary distributed worker pool configuration for AV simulation and/or AV code build, according to embodiments of the present disclosure.

FIG. 3 is a block diagram illustrating an exemplary distributed worker pool configuration 300 for AV simulation and/or AV code build, according to embodiments of the present disclosure. For instance, the worker pool 240 of FIG. 2 may be configured as shown in the configuration 300. As explained above, the worker pool 240 may be a shared pool of configurable resources distributed across multiple geographical locations. As shown, the worker pool 240 may include resources located at a plurality of regions 310 (shown as 310*a*, 310*b*, . . . , 310*c*). Some example regions

310 may include a region in Western United States, a region in Eastern United States, etc. Each region 310 may be partitioned into a plurality of zones or areas. In some instances, the different zones may correspond to different network data centers. For simplicity, FIG. 3 only illustrates zones 320 (shown as 320*a*, 320*b*, . . . , 320*c*) in the region 310*a*.

Each zone 320 may provision for various worker classes 330. A worker class 330 may be a template or a configuration of resource capacities. Different worker classes 330 may have different configurations for computational capacities, storage capacities, memory capacities, and/or network capacities. For instance, one worker class 330 may include a configuration for 12 CPU cores (e.g., the CPU cores 132), 4 GPU cores (e.g., the GPU cores 134), 350 GB of disk space (e.g., the storage resources 136), and 64 GB of memory (e.g., the memory 138), and another worker class 330 may include 4 CPU cores, 100 GB of storage resources, 32 GB of memory, and no GPU cores. In general, a zone 320 may provision for any suitable number of worker classes 330 with a configuration for any suitable combination of resources. For simplicity, FIG. 3 only illustrates worker classes 330 (shown as 330*a*, 330*b*, . . . , 330*c*) in the zone 320*a*.

Each worker class 330 may be instantiated into one or more worker instances or workers 332 (e.g., 1, 2, 3, 4, 5, 10, 20, 40, 100 or more). A worker 332 instantiated from a worker class 330 may have the resource capacities (for compute, storage, memory, and/or networking) as specified by the worker class 330. For simplicity, FIG. 3 only illustrates workers 332 (shown as 332*a*, 332*b*, . . . , 332*c*) of the worker class 330*a*.

As explained above with reference to FIG. 2, the scheduler 230 may schedule and assign jobs to workers in the worker pool 240. As an example, when the scheduler 230 receives a request for an AV simulation, and/or code build job from a client 210, the scheduler 230 may determine a suitable worker class 330 for the executing the job, for example, by matching resource requirements for performing the job to resource capacities of a worker class 330. The scheduler 230 may search for an available worker 332 of the matched worker class 330. Alternatively, the scheduler 230 may request for (or "spin up") a new worker 332 instantiated from the matched worker class 330. The instantiation of a worker 332 from a worker class 330 may refer to launching a worker 332 (or creating a VM) using a binary image having a resource configuration as specified by the corresponding worker class 330.

In some aspects, the worker pool 240 may provision for various types of workers, for example, including non-preemptible workers 332 (or "standard workers") and preemptible workers 332 of any suitable worker classes 330. The non-preemptible workers 332 may include committed workers that are already purchased at a certain cost, for example, by an organization that utilizes the system 200. The non-preemptible workers 332 can also include workers that can be launched (or "spin up") on-demand at a small additional cost. Once a non-preemptible worker 332 is launched, the non-preemptible worker 332 can be used by the infrastructure platform for as long as the infrastructure platform desires. On the other hand, a preemptible worker 332 may be requested (or "spin up") on-demand with a lower cost than the on-demand preemptible workers 332 but can be preempted (or taken away) at some time point of time. As such, while a preemptible worker 332 may have a lower cost, a task scheduled on a preemptible worker may have the risk of not running to completion and having to be rerun on another worker 332.

As explained above, an infrastructure platform capable of provisioning for a large number of AV simulation and/or code build jobs (e.g., hundreds of thousands of jobs per day) is essential in developing software and/or sensor systems for autonomous vehicles to operate in a wide multitude of driving scenarios, and the cost for provisioning resources to support the AV simulation and/or code build jobs can be high. Accordingly, the present disclosure provides techniques to efficiently schedule resources for AV simulation and/or code build jobs such that the infrastructure cost can be kept at a minimum while meeting the demands of the AV simulation and/or code build jobs.

Example Scheduling Schemes for AV Simulation and/or Code Build Jobs

Figure 4:
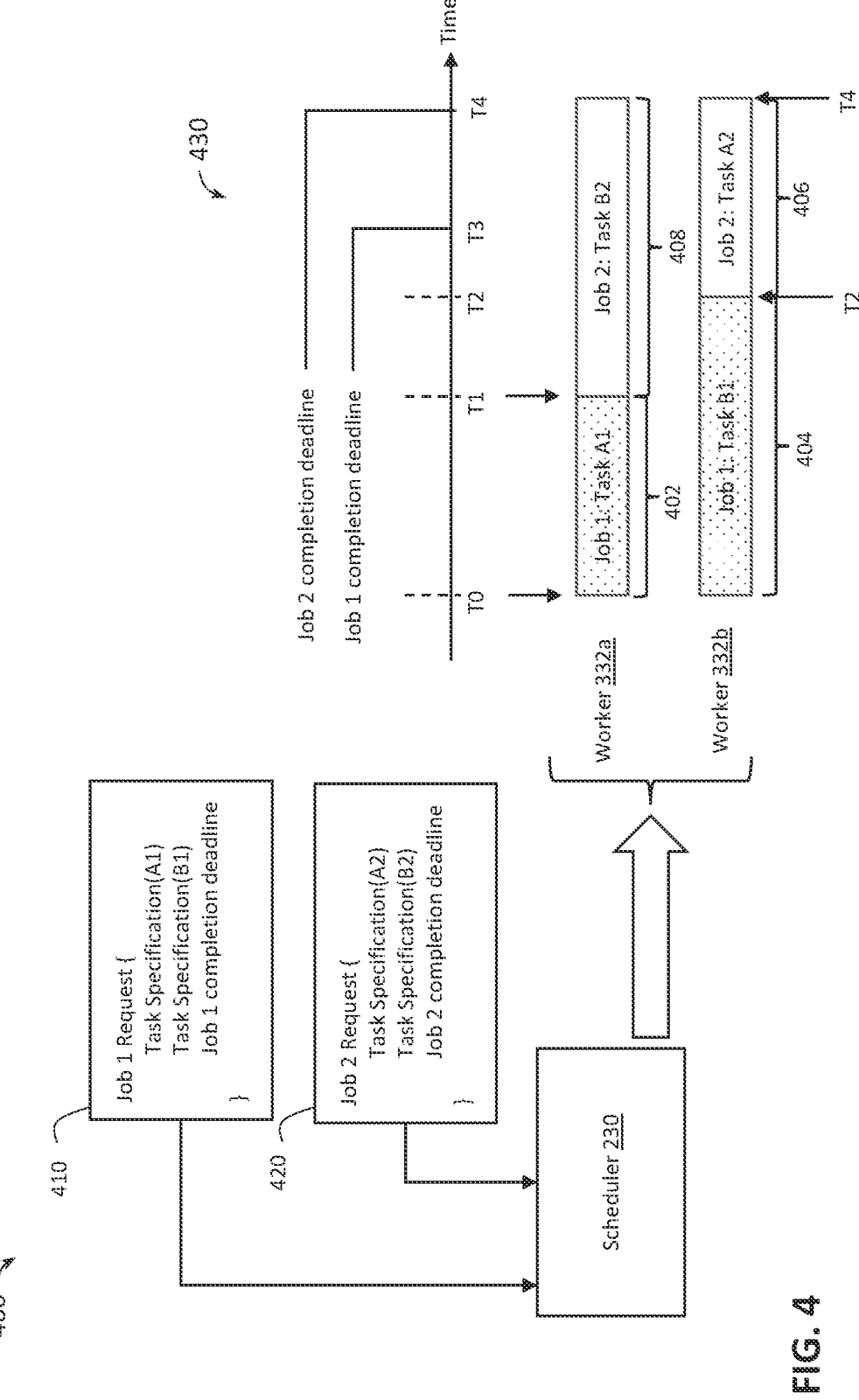
FIG. 4 illustrates an exemplary completion deadline goal-based scheduling scheme for AV simulation and/or AV code build, according to embodiments of the present disclosure.

FIG. 4 illustrates an exemplary completion deadline goal-based scheduling scheme 400 for AV simulation and/or AV code build, according to embodiments of the present disclosure. The scheme 400 may be implemented by the system 200 of FIG. 2. In particular, the scheduler 230 may perform task scheduling as shown in the scheme 400. At a high level, the scheduler 230 may receive, from clients such as the clients 110 and/or 210, job requests to execute AV simulation and/or code build jobs and may utilize a completion time-driven scheduling model (e.g., the completion time-driven scheduling model 730 shown in FIG. 7) to schedule and/or assign the requested jobs to one or more workers such as the workers 332. For simplicity, FIG. 4 illustrates the scheduler 230 receiving two job requests, each requesting execution of two tasks. However, the scheduler 230 may be scaled to receive and schedule any suitable number of job requests (e.g., 3, 4, 5, 6, 10, 50, 100, 500 or more) over a period. Further, each job may include any suitable number of tasks (e.g., 1, 2, 3, 4, 5, 6 or more).

As shown in FIG. 4, the scheduler 230 may receive a job request 410 and a job request 420. In some instances, the job request 410 and the job request 420 can be requested by the same client. In other instances, the job request 410 and the job request 420 can be requested by different clients. The job request 410 may request execution of a first AV simulation or code build job, represented by job 1, which may include task A1 and task B1. The job request 420 may request execution of a second AV simulation or code build job, represented by job 2, which may include task A2 and task B2. A client submitting an AV simulation and/or code build job to the scheduler may include a task specification for each task and a completion deadline for the job. As shown, the job request 410 may include a task specification (A1) for task A1, a task specification (B1) for task B1, and a completion deadline for job 1. Similarly, the job request 420 may include a task specification (A2) for task A2, a task specification (B2) for task B2, and a completion deadline for job 2.

Each task specification may specify instructions and/or information to facilitate execution of the corresponding task on a worker 332. As an example, the task specification (A1) may specify information (e.g., a filename, a file location, a universal resource identifier (URI), an URI location) for downloading AV driving scenario data, information for downloading an executable image (e.g., a container image) that performs task A1 when executed by a worker 332, and/or information for uploading AV artifacts upon completion of task A1. Some examples of AV driving scenario data may include objects associated with a certain driving scenario, ground truth data associated with an ML model trained for autonomous driving in the specific driving scenario, etc. The objects in the AV driving scenario data may include models (e.g., three-dimensional (3D) models) of real-world objects such as traffic lights, street lights, pedestrians, vehicles, buildings, environmental conditions, trees, plants, and/or any surroundings factors and/or elements in a city, for example, generated based on collected sensor data. Some examples of AV artifacts may include an AV driving score (e.g., an indication of how well an AV behaves or drives in a certain scenario), a simulation log, and/or an ML model prediction result. The task specification may also specify various other information such as a task name (e.g., "task A1"), a task identifier (ID) identifying task A1 from among tasks in the job 1, environment variables (e.g., a username, a development or release branch for version control) to be setup prior to execution of task A1, a worker class such as the worker class 330 (e.g., specifying CPU, GPU, storage, and/or memory resource requirements for executing the task), a priority of the task (e.g., within a predetermined number of priority levels), a run command (e.g., with input parameters) to execute an AV simulation, compile and execute an AV build, or compile and execute an AV release associated with the task, a condition or trigger for executing the task, tests or analysis to be applied to data processed by the task, completion handling (e.g., whether resources and/or AV driving scenario data is to be maintained or removed after completion of the task), etc. In a similar way, each of the task specification (B1), the task specification (A2) the task specification (B2) may include instructions and/or information to facilitate execution of the task B1, task A2, and task B2, respectively.

The completion deadline for a job may be a timestamp indicating a latest time or a target time by which the corresponding job is to be completed. The completion deadline may be AV-specific. For instance, the completion deadline may be associated with how critical the AV simulation, build, or release is to be rolled out for production or deployment in an AV (e.g., the AV 10 shown in FIG. 11). In some instances, an AV simulation job may have a more relaxed completion deadline than an AV code build job that is associated with a certain planned AV software or firmware release date. In some instances, the AV-specific completion deadline may correspond to one of a plurality of levels associated with AV production criticality. For example, in some instances, an AV simulation or code build associated with an improvement to a certain AV driving behaviour may can have a certain completion deadline (e.g., a target release date), but may not be as urgent as an AV simulation or code build associated with a bug fix that corrects a certain AV driving behaviour.

Instead of scheduling jobs and/or tasks using first-in-first-out (FIFO) mechanisms in an infrastructure system, the scheduler 230 may track the completion deadline for each job and create an execution plan that is optimized to meet completion deadlines across multiple jobs (e.g., concurrent jobs). For instance, the scheduler 230 may estimate a runtime for each individual task (e.g., task A1, task B1, task A2, task B2) using a task runtime model (e.g., the task runtime model 720 shown in FIG. 7). The task runtime model may be an ML model trained to estimate task runtimes based on task run historical data (e.g., including task runtimes and/or statistics from tasks executed in a previous day) as will be discussed more fully below with reference to FIG. 7. As an example, the job request 410 may specify a time T3 for job 1 completion deadline, and the job request 420 may specify a time T4 for job 2 completion deadline as shown by the timeline 430 where the x-axis represents time in some units. The scheduler 230 may estimate, using the task runtime model, a task runtime for each of the tasks A1, B1, A2, and B2. The estimated task runtimes for the tasks A1, B1, A2, and B2 are shown by durations 402, 404, 406, and 408, respectively.

The scheduler 230 may bin-pack task A1, task B1, task A2, task B2 onto one or more workers based on corresponding estimated runtime for the tasks, resource requirements for the corresponding tasks, and associated job completion deadlines so that task A1 and task B1 of job 1 may be executed within the specified completion deadline of time T3 and task A2 and task B2 of job 2 may be executed within the specified completion deadline of time T4. To that end, the scheduler 230 may determine a suitable worker for each of the tasks A1, B1, A2, and B2 by comparing the resource requirements of the corresponding task to the resource capacities of the worker. The scheduler 230 may fit the tasks A1, B1, A2, and B2 with different resource requirements and different estimated execution durations onto a set of workers 332 (e.g., "worker bins"). Based on the task execution durations and the ordering of the tasks, the scheduler 230 may calculate an estimated task start time for each task A1, B1, A2, and B2. Further, based on the task start times and the task execution duration for all corresponding tasks within a job, the scheduler 230 may determine an estimated job completion time for the job. The bin-packing is optimized such that a least number of workers can be used while meeting each of the job deadline. As an example, the scheduler 230 may bin-pack task A1 of job 1 and task B2 of job 2 onto the worker 332a and bin-pack task B1 of job 1 and task A2 of job 2 onto the worker 332b, where the worker 332a and the worker 332b may operate concurrently. Task A1 of job 1 may have a task start time of T0 (to be executed on the worker 332a), task B1 of job 1 may have a task start time of T0 (to be executed on the worker 332b), task A2 of job 2 may have a task start time of T2 (to be executed on the worker 332a after task A1), and task B2 may have a task start time of T1 (to be executed on the worker 332b after task B1). With such bin-packing, job 1 can be completed at time T2 before job 1 completion deadline at time T3, and job 2 can be completed at time T4 as specified by job 2 completion deadline.

While FIG. 4 illustrates that the scheduler 230 schedules two workers 332a and 332b to execute job 1 and job 2, in general, the scheduler 230 may schedule any suitable number of workers to execute requested jobs (e.g., concurrent jobs). Further, in some aspects, the scheduler 230 can perform online bin-packing upon receiving a job request to add new tasks to an existing schedule (for one or more workers 332) and perform offline bin-packing periodically to re-optimize task ordering.

As discussed above, different worker classes or workers may have different resource capacities, for example, at least one of different compute capacities, different memory capacities, different storage capacities, or different network capacities. In some aspects, the scheduler 230 may schedule a task (e.g., the task A1, B1, A2, B2) on a worker with a worker class (e.g., the worker class 330) matched to the task's resource requirements. For instance, if a task requires 2 CPU cores, 4 GPU cores, 64 GB of memory, and 256 GB of disk storage, the scheduler 230 may schedule the task on a worker instantiated from a worker class with a configuration for 2 CPU cores, 4 GPU cores, 64 GB of memory, and 256 GB of disk storage matched to the task resource requirements. In other aspects, instead of launching (or "spin up") an on-demand worker with resource capacities matched to the task resource requirements, the scheduler 230 can schedule the task on an available worker (e.g., a committed worker) having higher resource capacities than the task resource requirements. Referring to the same task resource requirement example, the scheduler 230 may schedule the task on an available worker (e.g., a committed worker) having 4 CPU cores, 8 GPU cores, 64 GB of memory, and 256 GB of disk storage. Removing the constraint to match a task's resource requirements to a worker's resource capacities can advantageously avoid spending an additional cost to add an on-demand worker.

Figure 5:
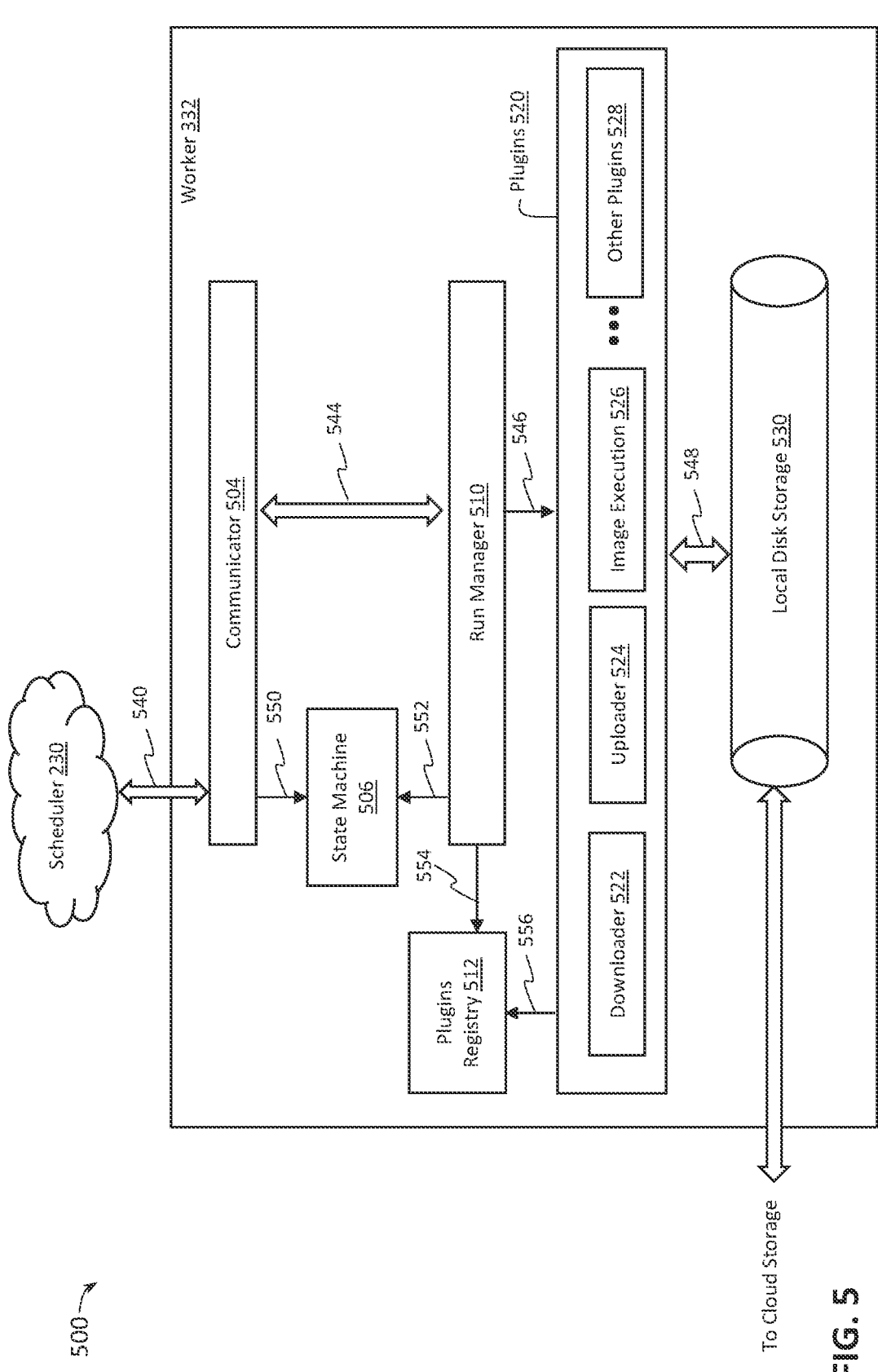
FIG. 5 illustrates an exemplary scheduling scheme for AV simulation and/or AV code build, according to embodiments of the present disclosure.

FIG. 5 illustrates an exemplary scheduling scheme 500 for AV simulation and/or AV code build, according to embodiments of the present disclosure. The scheme 500 may be implemented by the system 200. In particular, the scheduler 230 may coordinate with the worker 332 to perform task scheduling as shown in the scheme 500. FIG. 5 provides a more detailed view of internal components of a worker 332 and interactions with the scheduler 230. For simplicity, FIG. 5 illustrates the scheduler 230 communicating with one worker 332. However, the scheduler 230 may be scaled to communicate with any suitable number of workers 332 (e.g., 2, 3, 4, 10, 20, 100, 200, 500, 1000, etc.) at a given time. As shown, the worker 332 may include a communicator component 504, a state machine 506, a run manager 510, a plugins registry 512, a plurality of plugins 520, and a local disk storage 530. The plurality of plugins 520 may include, but is not limited to, one or more downloaders 522, one or more uploaders 524, one or more image execution components 526, and one or more other plugins 528. Some examples for the plugins 528 may include role-based encryption (RBE) Downloader, RBE Uploader, Task Sequencer, Task Parallelizer, Map Downloader, Bag Downloader, etc.

The communicator component 504 may implement a set of APIs to facilitate communication (e.g., via RPCs) between the scheduler 230 and the worker 332. For instance, at 540, the scheduler 230 may assign a task to the worker 332, cancel a task on the worker 332, and/or read the status of a task on the worker 332 via the communicator component 504. In some aspects, the scheduler 230 may assign a task to the worker 332 by transmitting a task specification for the task. The task specification may be similar to the task specification (A1), the task specification (B1), the task specification (A2), and the task specification (B2) discussed above with reference to FIG. 4 and may be received in a job request (e.g., the job requests 410 and/or 420). The communicator component 504 may communicate with the run manager 510. For instance, at 544, the communicator component 504 may request the run manager 510 to execute a task assigned to the worker 332, receive a run progress associated with a task assigned to the worker 332, and/or receive a run completion status for a task assigned to the worker 332.

Upon receiving a task assignment, the run manager 510 may partition the task into a sequence of stages, for example, including an AV asset downloading stage, an image execution stage, and an AV artifact uploading stage. At 546, the run manager 510 may communicate with the plugins 520 to execute the different stages for the task. To that end, the run manager 510 may request the downloader 522 to download AV assets to the local disk storage 530 (shown by 548), where the AV assets may include AV driving scenario data and/or the task image (e.g., from cloud storage location (s) specified by the task specification) during the AV asset downloading stage. After the AV asset download is completed, the run manager 510 may request the image execution component 526 to execute the task image. The execution of the task image may produce various AV artifacts and store the AV artifacts at the local disk storage 530 (shown by 548), where the AV artifacts may include an AV driving score, a simulation log, or an ML model prediction. Thus, after execution of the task image, the run manager 510 may request the uploader 524 to upload the AV artifacts (e.g., to cloud storage location (s) specified by the task specification) . In some aspects, the run manager 510 may have knowledge of compute, memory, storage, and/or network resources that are required by the task (based on a corresponding task specification) as well as knowledge of compute, memory, storage, and/or network resources available at the worker 332, the run manager 510 may apply pipeline processing to process multiple tasks at the same time to better utilize the available resources at the worker 332. Stated differently, the scheduler 230 may perform resource-aware multiple AV task runs. An example pipeline schedule for AV simulation and/or code build job will be shown and discussed more fully below with reference to FIG. 6.

In some aspects, the plugins 520 may communicate with the plugins registry component 512. For instance, at 556, the plugins 520 register with the plugins registry component 512 so that the workers 332 may have information associated with the set of plugins 520 available at the worker 332. In some examples, the plugins registry component 512 may store binaries (e.g., libraries and/or executables) for the plugins 520 and associated version information and/or any other information associated with the plugins 520. In some aspects, the run manager 510 may communicate with the plugins registry 512. For instance, at 554, the run manager 510 may request a certain plugin 520 from the plugins registry component 512 and the requested plugin may be installed onto the worker 332.

In some aspects, the run manager 510 may communicate with the state machine 506, which may track the state of the worker 332 with respect to task executions. Some example of worker states may include a waiting state, a busy state, and an accepting state. A waiting state may refer to a state during which the worker 332 has no task execution in-progress (e.g., no task run, meaning the worker 332 is in an idle state). A busy state may refer to a state during which the worker 332 is busy with executing a task (or multiple tasks when pipeline/parallel execution is used). An accepting state may refer to a state during which the worker 332 is upload-ing AV artifacts for a previous task run and can accept a new task for execution. For instance, at 552, the run manager 510 may write a state to the state machine 506 to indicate that the worker 332 is in a busy state when the run manager 510 kicks of a task (e.g., start downloading AV assets). Subse-quently, the run manager 510 may update the state machine 506 to indicate that the worker 332 is in an accepting state when the task execution is completed and in the process of uploading AV artifacts. After the AV artifact upload is completed, the run manager 510 may again update the state machine 506 to indicate that the worker 332 is in a waiting state if there is no other task assigned to the worker 332. Alternatively, the run manager 510 may begin execution of a next task assigned to the worker 332 and update the state machine 506 with a busy state. In general, the run manager 510 may update the worker 332's state to the state machine 506 as the different task stages progress. In some aspects, the communicator component 504 may communicate with the state machine 506. For instance, at 550, the communicator component 504 may read a state from the state machine 506 when the scheduler 230 requests for a status of the worker 332 (e.g., to determine whether to assign another task to the worker 332). Subsequently, the communicator component 504 may return an indication of the read state to the scheduler 230.

In some aspects, the local disk storage 530 may be managed by a local disk manager. In some aspects, the worker 332 may also include a cache separate from the local disk storage 530 and/or as part of the local disk storage 530, and the local disk manager may cache data (from the AV asset download or AV artifacts produced by the task execu-tion), for example, having knowledge that a subsequent task may operate on the data so that unnecessary access to the cloud storage can be avoided, and thus improve resource utilization.

Figure 6:
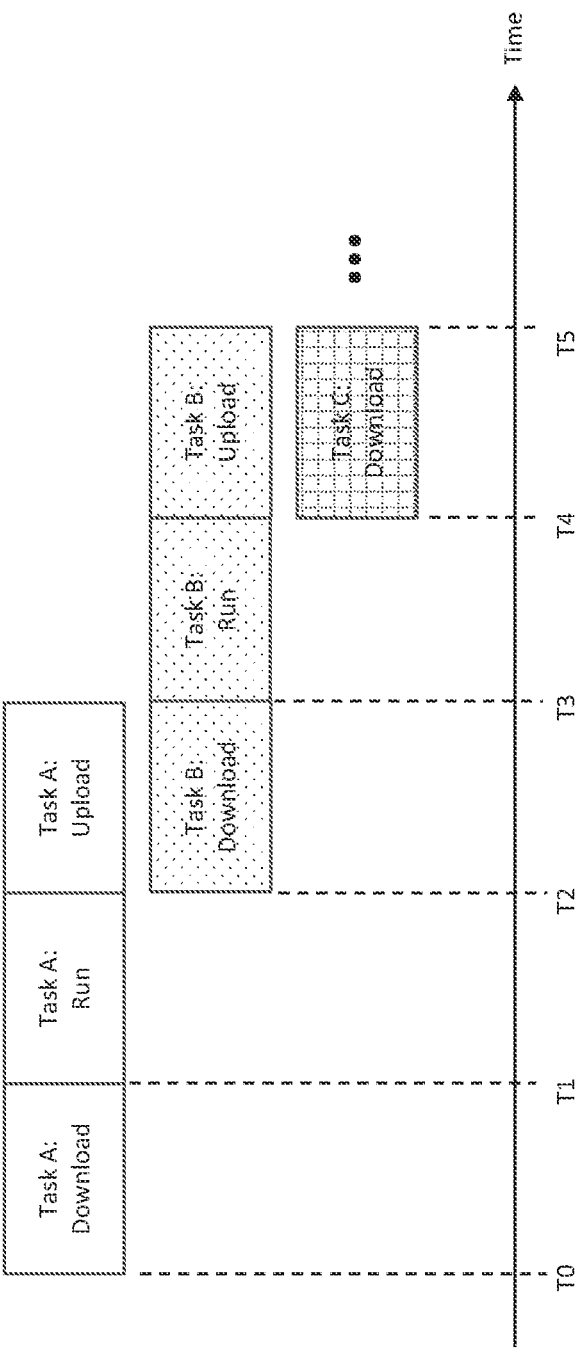
FIG. 6 is a timing diagram illustrating an exemplary pipeline schedule for AV simulation and/or AV code build, according to embodiments of the present disclosure.

FIG. 6 is a timing diagram illustrating an exemplary pipeline schedule 600 for AV simulation and/or code build according to embodiments of the present disclosure. The schedule 600 may correspond to a schedule generated by the run manager 510 of FIG. 5. In FIG. 6, the x-axis represents time in some units. As explained above, a task may be partitioned into multiple stages including an AV asset down-loading stage, an image run stage, and an AV artifact uploading stage so that different stages requiring different resources (e.g., different compute, memory, storage, and/or network resources) may be run at the same time to better utilize resources.

In the illustrated example of FIG. 6, the run manager 510 may schedule a task A to run from time T0 to T3, where the AV asset downloading stage, the image run stage, and the AV artifact uploading stage are performed in sequence as shown. The run manager 510 may apply pipelining to run multiple tasks having different resource requirements concurrently. For instance, the run manager 510 may schedule the AV artifact uploading stage of the task A to be run concurrently with an AV asset downloading stage of a next task B, for example, from time T2 to T3, based on the AV artifact uploading stage of the task A and the AV asset downloading stage of the task B having different resource requirements. For instance, the AV asset downloading stage of the task B may utilize a disk storage resource and a downloading bandwidth, whereas the AV artifact uploading stage of the task A may not utilize a disk storage resource and may utilize an uploading bandwidth. Similarly, the run manager 510 may schedule an AV artifact uploading stage of the task B to be run concurrently with an AV asset downloading stage of a next task C, for example, from time T4 to T5, based on the AV artifact uploading stage of the task B and the AV asset downloading stage of the task C having different resource requirements, and so on. In general, the run manager 510 may partition a task into stages of any suitable granularity and assign different stages of tasks to be run concurrently based on the resource requirements for the corresponding stages.

Figure 7:
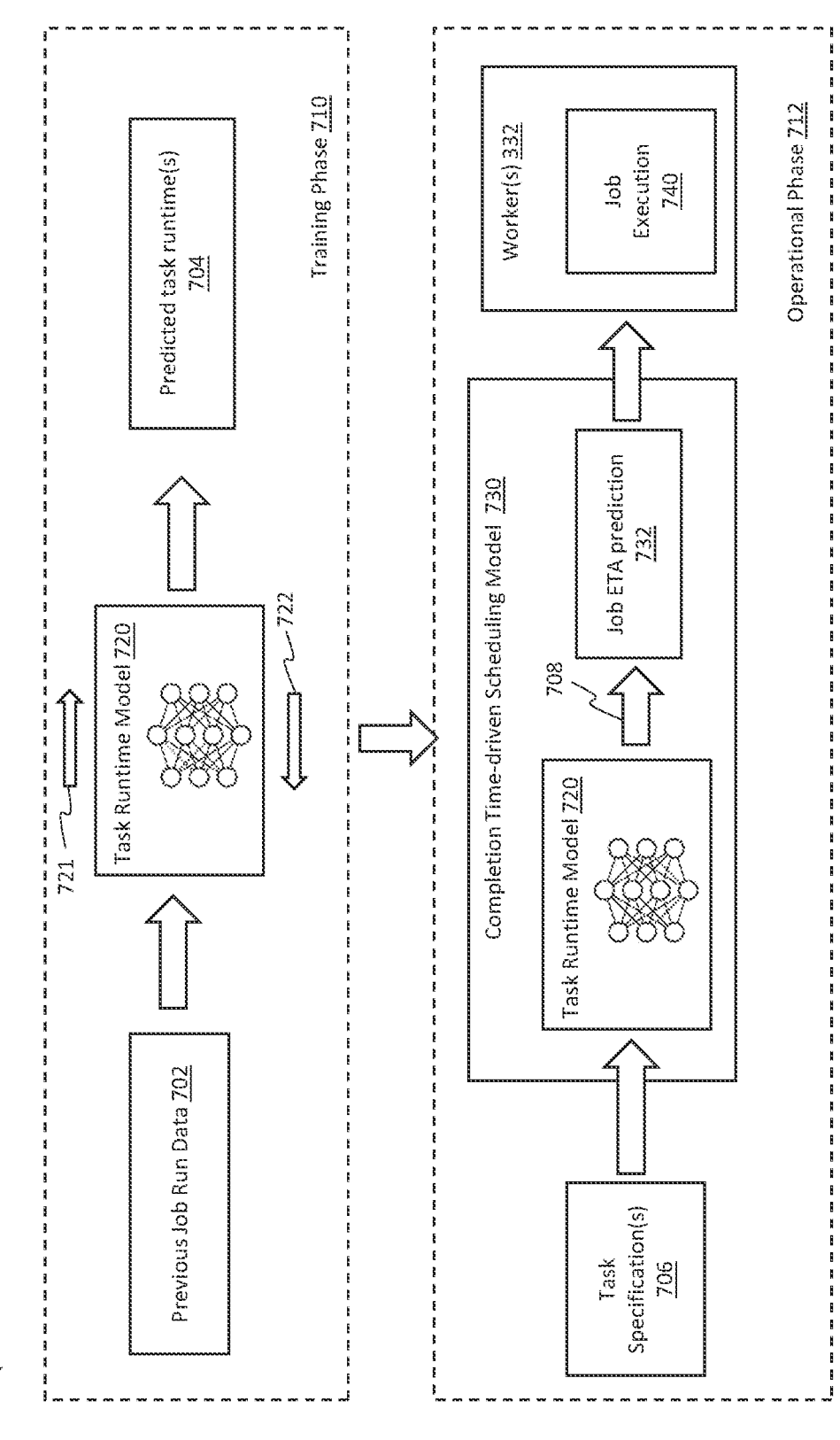
FIG. 7 illustrates an exemplary machine learning (ML) model-based scheduling scheme for AV simulation and/or AV code build, according to embodiments of the present disclosure.

FIG. 7 illustrates an exemplary ML model-based sched-uling scheme 700 for AV simulation and/or AV code build, according to embodiments of the present disclosure. The scheme 700 may be implemented by the system 200. In particular, the scheduler 230 may perform task scheduling as shown in the scheme 700. The scheme 700 can be imple-mented in conjunction with the schemes 400 and/or 500 discussed above with reference to FIGS. 4, and/or 5, respec-tively. As discussed above, the scheduler 230 may utilize a task runtime model (e.g., a task runtime model 720) to estimate a task runtime for a wide variety of tasks associated with AV simulation and/or code build jobs when scheduling worker(s) 332 to process the jobs. FIG. 7 provides additional detail associated with the training and application of the task runtime model.

The scheme 700 may include a training phase 710 (e.g., an offline process) and an operational phase 712 (e.g., an online process). During the training phase 710, the task runtime model 720 may be trained to estimate a runtime for a task. For instance, the task runtime model 720 may be an ML model, which may be implemented as neural networks, deep learning networks, convolutional neural networks (CNNs), recurrent neural networks (RNNs), or the like. The task runtime model 720 may include a plurality of layers, for example, an input layer, followed by one or more hidden layers and an output layer. Each layer may include a set of weights and/or biases that can transform inputs received from a previous layer and the resulting outputs can be passed to the next layer. The weights and/or biases in each layer can be trained and adapted, for example, to estimate a duration to complete an execution (e.g., a runtime) of a task associated with an AV simulation and/or code build job.

As shown, the task runtime model 720 may receive previous job run data 702 (e.g., a recorded job run history or log). The previous job run data 702 may include timing information associated with execution of previous tasks, for example, the tasks A1, B1, A2, B2 discussed above with reference to FIG. 4. In some examples, the previous job run data 702 may include a list of previously executed tasks including associated task names, task types, workers (e.g., the workers 332) that executed the task, task runtimes, job types, job completion deadlines, etc. The task runtime model 720 may be applied to the previous job run data 702. In this regard, the previous job run data 702 (e.g., excluding the task runtimes) may be processed by each layer of the task runtime model 720 (in a feedforward process 721), and the task runtime model 720 may output a predicted task runtime 704 for each task in the previous job run data 702. A decision can be made for each task to determine whether the task runtime model 720 can successfully predict a task runtime for each task, for example, by comparing the predicted task runtime 704 for each task to a corresponding recorded task runtime in the previous job run data 702. That is, the recorded task runtimes may operate as the ground truths for the training. A backward propagation process 722 may be applied as part of the training. The backward propagation process 722 may perform a backward pass through the layers in the task runtime model 720 while adjusting the weights and/or biases at each layer. The backward propagation process 722 can be repeated to minimize an error (e.g., a gradient) between the output of the task runtime model 720 and a desired output (e.g., a corresponding recorded task runtime in the previous job runtime data 702). For instance, after adjusting the weights and/or biases, a feedforward process 721 may be again applied on the previous job run data 702, followed by another backward propagation process 722. The training (e.g., the feedforward process 721 and the backward propagation process 722) can be iterated until the error between the predicted task runtime 704 and a corresponding recorded task time satisfies a certain threshold (e.g., less than an error of about 1 minute (min), 2 mins, 3 mins, 4 mins, 5 mins, 6 mins or more compared to the ground truth). In some aspects, the task runtime model 720 can be trained every night with the error estimation threshold set to about 5 mins of the actual completion time.

After training the task runtime model 720, the scheduler 230 may utilize the trained task runtime model 720 for scheduling. For instance, during the operational phase 712, the scheduler 230 may receive job requests (e.g., the job requests 410 and 420), each including a job completion deadline and a list of tasks (e.g., the tasks A1, B1, A2, and/or B2) task specifications 706 (each associated with a task) as discussed above with reference to FIG. 4. The scheduler 230 may utilize a completion time-driven scheduling model 730 to schedule the tasks for execution such that all tasks for a certain job are executed within the corresponding specified job completion deadline. The completion time-driven scheduling model 730 may include the trained task runtime model 720. The task runtime model 720 may process the task specifications 706 using the feedforward process 721 and output an estimated or predicted task runtime 708 for each task. The completion time-driven scheduling model 730 may further include a job estimated time of arrival (ETA) prediction component 732. The job ETA prediction component 732 may perform bin-packing to assign the tasks to one or more workers 332 operating concurrently, determine task start times for each task based on a corresponding estimated task runtime 708, and determine a completion time for the job based on the associated task start times and estimated task runtimes as discussed above with reference to FIG. 4. Subsequently, the scheduler 230 may schedule one or more workers 332 to execute the jobs according to the determined schedule. Each of the scheduled workers 332 may include a job execution component 740 configured to execute tasks according to respective task specifications, for example, using multi-stage and pipelining mechanisms as discussed above with reference to FIGS. 5 and 6.

As discussed above, the scheduler 230 may receive run-progresses or statuses (e.g., completion statuses) for tasks executed on a worker 332. Accordingly, a task run history or log (e.g., including task runtime(s) and corresponding task specifications) can be generated so that task runtime model 720 can be refined or retrained using the task run history. That is, the training phase 710 can be repeated periodically (e.g., every day, every few hours, or at any suitable frequency) to train and update the task runtime model 720 based on a task run history (e.g., the previous job run data 702).

Figure 8:
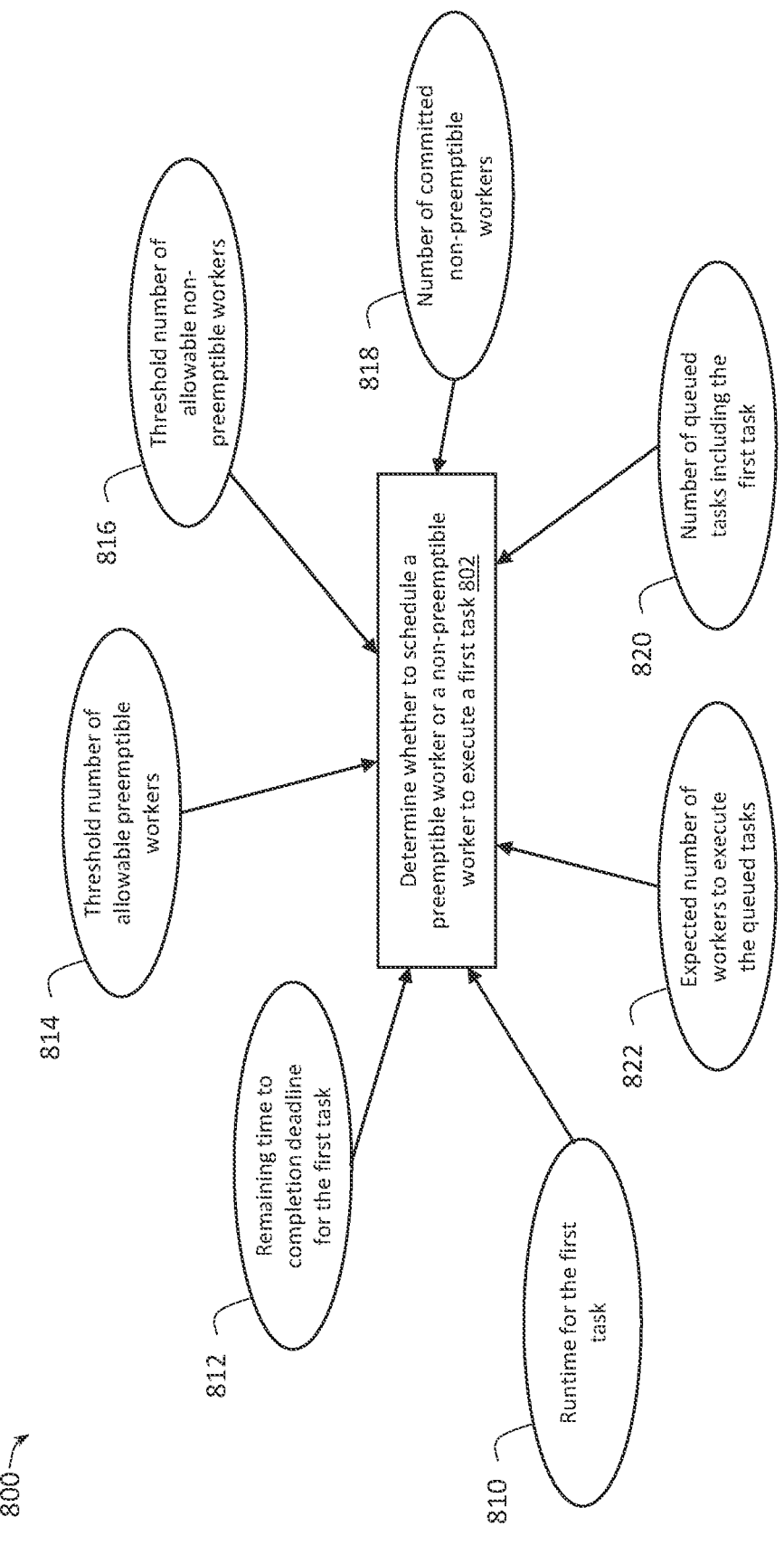
FIG. 8 illustrates an exemplary scheduling scheme for AV simulation and/or AV code build, according to embodiments of the present disclosure.

FIG. 8 illustrates an exemplary scheduling scheme 800 for AV simulation and/or AV code build, according to embodiments of the present disclosure. The scheme 800 may be implemented by the system 200. In particular, the scheduler 230 may perform task scheduling as shown in the scheme 800. The scheme 800 can be implemented in conjunction with the schemes 400, 500, and/or 700 discussed above with reference to FIGS. 4, 5, and/or 7, respectively.

As discussed above, a scheduler 230 can utilize a combination of non-preemptible workers (e.g., the workers 332) and preemptible workers (e.g., the workers 332) to execute tasks for AV simulation and/or code build jobs. The non-preemptible workers may include committed workers (e.g., already purchased at a certain cost irrespective of whether they are being used or not) and on-demand workers that can be launched as necessary at a small additional cost. The preemptible workers may have a lower cost than the on-demand workers but can be preempted (or taken away) at some time point of time, and thus a task (e.g., the tasks A1, B1, A2, and/or B2) scheduled on a preemptible worker may have the risk of not running to completion and having to be rerun on another worker.

To balance the cost and the risk of using preemptible workers 332, at 802, the scheduler 230 may determine whether to schedule a preemptible worker or a non-preemptible worker to execute each task in a queue based on various factors. For instance, the determination may be based on a task runtime for the task as shown by 810, a remaining time to the completion deadline for the task as shown by 812, a threshold number of allowable preemptible workers as shown by 814, a threshold number of allowable non-preemptible workers as shown by 816, a number of committed non-preemptible workers as shown by 818, a total number of queued tasks as shown by 820, and/or an expected number of workers to execute the queued tasks 822.

In some instances, the number of committed non-preemptible workers 818 may be referred to as a minimum usage. Because the committed non-preemptible workers are already paid for irrespective of whether they are being used or not, the scheduler 230 may prioritize the committed non-preemptible workers for scheduling. In some instances, the threshold number of allowable non-preemptible workers 816 may be referred to as a maximum usage. For example, a discounted price may apply if the total number of CPU cores (e.g., the CPU cores 132) used by the system 200 does not exceed a certain threshold and/or if the total number of GPU cores (e.g., the GPU cores 134) does not exceed a certain threshold. The threshold number of allowable non-preemptible workers 816 may be an upper bound for a total number of non-preemptible workers including the committed non-preemptible workers and the on-demand non-preemptible workers. As such, the scheduler 230 may avoid utilizing a greater number of non-preemptible workers than the threshold number of allowable non-preemptible workers 816. In some instances, the threshold number of allowable preemptible workers 814 may be referred to as a preemptible worker instance quota. Because a preemptible worker can be preempted causing a task to be rerun as explained above, it may be desirable to limit the number of preemptible workers that the scheduler 230 may use to minimize the risk of having to spin up more non-preemptible workers (e.g., causing a total number of scheduled non-preemptible workers to exceed the threshold number of allowable non-preemptible workers 818) at a later time to rerun failed tasks (due to preemption of the preemptible workers).

As explained above, the scheduler 230 may use bin-packing to determine an expected number of worker instances required to execute all queued tasks. The expected number of worker instances to execute queued tasks 822 may be referred to as a standard fit. That is, the expected number of worker instances to execute queued tasks 822 may be a total number of worker instances (including non-preemptible worker instances and preemptible worker instances) to be scheduled at a given time.

In some aspects, the scheduler 230 may determine whether to schedule a task on a preemptible worker or a non-preemptible worker based at least in part on an expected or estimated runtime (e.g., using the task runtime model 720) for the task and a remaining time to a job completion deadline associated with the task. For instance, if there is a sufficient amount of time until the completion goal (e.g., the associated job completion deadline) to allow for running the task on a preemptible worker instance and rerunning the task on a standard worker instance (a committed or on-demand non-preemptible worker instance) in case the task fails to run to completion on the preemptible worker instance, the scheduler 230 may schedule the task on a preemptible worker instance. Otherwise, the scheduler 230 may schedule the task on a non-preemptible worker instance.

In some aspects, because of the lower cost for the preemptible worker instances, it may be desirable for the scheduler 230 to utilize a fewer number of standard worker instances than the standard fit (e.g., the expected number of worker instances to execute queued tasks 822) and move at least some queued tasks to be executed on preemptible worker instances provided certain constraints can be satisfied where the constraints may be based on the determination factors 810, 812, 814, 816, 818, 820, and 822 discussed above.

As an example, if the scheduler 230 utilizes a few number of standard worker instances than the standard fit, some of the tasks may have to be run on preemptible workers instances and may have to be rerun on standard worker instances at a later time (upon preemption of the preemptible workers). As such, the scheduler 230 may utilize the following constraint for scheduling:

$$\text{standard fit} + (\text{standard fit} - \text{standard worker instance count}) < \text{maximum usage.} \qquad (1)$$

Thus, the scheduler 230 may schedule a number of standard worker instances according to the following constraint:

$$\text{Standard worker instance count} > \text{standard fit} * 2 - \text{maximum usage.} \qquad (2)$$

The scheduler 230 may further consider the number of queued urgent tasks (e.g., that cannot be scheduled on a preemptible worker instances based on corresponding estimated runtime and completion goal discussed above) and the committed usage when determining a number of standard worker instances to schedule as shown below:

$$\text{Standard worker instance count} = \max(\text{number of urgent tasks, committed usage, standard fit} * 2 - \text{maximum usage).} \qquad (3)$$

In other words, the scheduler 230 may determine a number of non-preemptible workers based on a number of urgent tasks, a number of committed non-preemptible workers 818 (e.g., committed usage), the expected number of workers to execute the queued tasks 822, and the threshold number of allowable non-preemptible workers 818 (e.g., maximum usage). Next, the scheduler 230 may determine the number of preemptible worker instances to spin up as shown be below:

$$\text{Preemptible instance count} = \min(\text{preemptible quota, total number of tasks} - \text{standard instance count).} \qquad (4)$$

In other words, the scheduler 230 may determine a number of preemptible workers based on the threshold number of allowable preemptible workers (e.g., the preemptible quota), a number of number of urgent tasks, a number of committed non-preemptible workers 818 (e.g., committed usage), the expected number of workers to execute the queued tasks 822, the number of queued tasks 820, and the standard worker instance count as shown in equation (3).

As an example, when there is no urgent task (in the queue) and no committed usage, the scheduler 230 may spin up preemptible workers, as long as the number of preemptible workers satisfies the threshold number of preemptible workers 814. For instance, if there are four non-urgent tasks to be scheduled, the scheduler 230 has queue up four non-urgent tasks, each almost halfway to their associated job deadlines, the scheduler 230 can spin up four preemptible workers to execute the non-urgent tasks and upon failure to run the four tasks to completion, the scheduler 230 may spin up four standard workers to rerun the tasks on the standard workers. If, however, one of the four tasks is an urgent task, the scheduler 230 may spin up a standard worker to execute the urgent task and execute the other three tasks on preemptible workers. As another example, when there is no urgent task (in the queue) and no committed usage (e.g., number of committed non-preemptible workers 818) but with a maximum usage of 3 standard workers, the scheduler 230 may determine a number of standard workers to spin up according to equation (2) as follows:

$$(2*\text{ideal fit-max workers})=2*2-3=1. \tag{5}$$

That is, the scheduler 230 may spin up one standard worker to execute one of the tasks and spin up three preemptible workers to execute the remaining three tasks.

In general, an AV infrastructure scheduler (e.g., the scheduling service layer 120 and/or the scheduler 230) can coordinate with workers (e.g., the workers 332) to schedule AV simulation and/or code build jobs using any suitable combination of mechanisms discussed above with reference to FIGS. 2-8.

Example Method for Scheduling AV Simulation and/or Code Build Jobs

FIG. 9 is a flow diagram illustrating a scheduling process 900 for AV simulation and/or AV code build, according to some embodiments of the present disclosure. The process 900 can be implemented by the computer system 1200 of FIG. 12 and/or a worker similar to the worker 332 discussed above with reference to FIGS. 3-8. Although the operations of the process 900 may be illustrated with reference to particular embodiments of the computer system 1200 disclosed herein, the process 900 may be performed using any suitable hardware components and/or software components. The process 900 may utilize similar mechanisms discussed above with reference to FIGS. 2-8. Operations are illustrated once each and in a particular order in FIG. 9, but the operations may be performed in parallel, reordered, and/or repeated as desired.

At 902, a first task specification for a first task associated with at least one of a first AV simulation or a first AV code build may be received. The first task may be similar to the tasks A1, B1, A2, and/or B2, and the first task specification may be similar to the task specification (A1), the task specification (B1), the task specification (A2), and/or the task specification (B2) discussed above with reference to FIG. 4. In some aspects, means for performing the functionality of 902 can, but not necessarily, include, for example, the memory 1210, the processing unit(s) 1220, and/or the network communication interface 1230 with reference to FIG. 12. In some examples, the processing unit(s) 1220 may execute instruction 1212 to perform the functionality of 902.

At 904, a second task specification for a second task associated with at least one of a second AV simulation or a second AV code build may be received. The second task may be similar to the tasks A1, B1, A2, and/or B2, and the second task specification may be similar to the task specification (A1), the task specification (B1), the task specification (A2), and/or the task specification (B2) as discussed above. Further, in some instances, the at least one of the second AV simulation or the second AV code build may be the same as the at least one of the first AV simulation or the first AV code build. In other instances, the at least one of the second AV simulation or the second AV code build may be different from the at least one of the first AV simulation or the first AV code build. In some aspects, means for performing the functionality of 904 can, but not necessarily, include, for example, the memory 1210, the processing unit(s) 1220, and/or the network communication interface 1230 with reference to FIG. 12. In some examples, the processing unit(s) 1220 may execute instruction 1212 to perform the functionality of 904.

At 906, a portion of the first task is executed concurrently with a portion of the second task based at least in part on the portion of the first task and the portion of the second task have different resource requirements. The portion of the first task may be associated with one of an AV asset download, an AV code execution, or an AV artifact upload, and the portion of the second task may be associated with a different one of the AV asset download, the AV code execution, or the AV artifact upload. In some aspects, the portion of the first task executed concurrently with the portion of the second task may be associated with the AV asset download, and the portion of the second task may be associated with the AV artifact upload, for example, as discussed above with reference to FIG. 6. In some aspects, the AV asset download may include downloading AV driving scenario data including at least one of objects (e.g., 3D models) associated with an AV driving scenario, or ground truth data associated with an ML model trained for the AV driving scenario. In some aspects, the AV artifacts upload may include uploading at least one of an AV driving score associated with an AV driving scenario, an AV simulation log associated with the AV driving scenario, or a machine learning model prediction associated with the AV driving scenario. In some aspects, the executing the portion of the first task concurrently with the portion of the second task is further based on the portion of the first task and the portion of the second task having at least one of different compute resource requirements (e.g., different number of CPU cores 132 and/or different number of GPU cores), different memory resource requirements (e.g., different amount of memory 138), different storage resource requirements (e.g., different amount storages 136), or different network resource requirements (e.g., different network resources 140). In some aspects, means for performing the functionality of 906 can, but not necessarily, include, for example, the memory 1210, the processing unit(s) 1220, and/or the network communication interface 1230 with reference to FIG. 12. In some examples, the processing unit(s) 1220 may execute instruction 1212 to perform the functionality of 906.

In some aspects, the process 900 may further include executing a portion of a third task associated with at least one of a third AV simulation or a third AV code build, where the third task is different from the second task. In some instances, the at least one of the third AV simulation or the third AV code build may be the same as the at least one of the first AV simulation or the first AV code build or the at least one of the second AV simulation or the second AV code build. In other instances, the at least one of the third AV simulation or the third AV code build may be different from the at least one of the first AV simulation or the first AV code build and the at least one of the second AV simulation or the second AV code build.

In some aspects, the process 900 may further include receiving a job request to execute one or more tasks including the first task, wherein the job request includes a task specification specifying information for downloading AV driving scenario data for the first task and information for uploading AV artifacts associated with the first task. In some instances, the one or more tasks may include the second task and the job request may include the second task specification, for example, where the at least one of the first AV simulation or the first AV code build is the same as the at least one of the second AV simulation or the second AV code build. In other instances, the process 900 may further include receiving a second, separate, job request to execute at least the second task and the job request may include the second task specification, for example, where the at least one of the first AV simulation or the first AV code build is different than the at least one of the second AV simulation or the second AV code build.

FIG. 10 is a flow diagram illustrating a scheduling process 1000 for AV simulation and/or AV code build, according to some embodiments of the present disclosure. The process 1000 can be implemented by the computer system 1200 of FIG. 12 and/or the scheduler 230 discussed above with reference to FIGS. 2-8. Although the operations of the process 1000 may be illustrated with reference to particular embodiments of the computer system 1200 disclosed herein, the process 1000 may be performed using any suitable hardware components and/or software components. The process 1000 may utilize similar mechanisms discussed above with reference to FIGS. 2-8. Operations are illustrated once each and in a particular order in FIG. 10, but the operations may be performed in parallel, reordered, and/or repeated as desired.

At 1002, a first job request to execute one or more tasks associated with at least one of a first autonomous vehicle (AV) simulation or a first AV code build may be received. The first job request may include a task specification specifying AV driving scenario data for a first task of the one or more tasks and a job completion deadline associated with the one or more tasks. The first task may be similar to the tasks A1, B1, A2, and/or B2, the task specification may be similar to the task specification (A1), the task specification (B1), the task specification (A2), and/or the task specification (B2), and the job completion deadline may be similar to the job 1 completion deadline or the job 2 completion deadline discussed above with reference to FIG. 4. In some aspects, means for performing the functionality of 1002 can, but not necessarily, include, for example, the memory 1210, the processing unit(s) 1220, and/or the network communication interface 1230 with reference to FIG. 12. In some examples, the processing unit(s) 1220 may execute instruction 1212 to perform the functionality of 1002.

At 1004, one or more workers (e.g., the workers 332) may be scheduled to execute the first task within the job completion deadline using a completion time-driven scheduling model. In some aspects, the completion time-driven scheduling model may include a task runtime model trained for task runtime estimation based on task runtime data associated with at least one of a second AV simulation or a second AV code build different from the at least one of the first AV simulation or the first AV code build. For instance, the completion time-driven scheduling model may be similar to the completion time-driven scheduling model 730, and the task runtime model may be similar to the task runtime model 720 as discussed above with reference to FIG. 7. In some aspects, means for performing the functionality of 1004 can, but not necessarily, include, for example, the memory 1210, the processing unit(s) 1220, and/or the network communication interface 1230 with reference to FIG. 12. In some examples, the processing unit(s) 1220 may execute instruction 1212 to perform the functionality of 1004.

At 1006, the task specification may be transmitted to the one or more workers. In some aspects, means for performing the functionality of 1006 can, but not necessarily, include, for example, the memory 1210, the processing unit(s) 1220, and/or the network communication interface 1230 with reference to FIG. 12. In some examples, the processing unit(s) 1220 may execute instruction 1212 to perform the functionality of 1006.

In some aspects, the process 1000 may further include receiving a completion indication for the first task and updating the task runtime model based on a task runtime and the task specification for the first task, where the task runtime is based at least in part on the completion indication, for example, as discussed above with reference to FIG. 7.

In some aspects, the scheduling at 1004 may include generating an estimated runtime for the first task by applying the task runtime model to the task specification and calculating an estimated job completion time based at least in part on the estimated runtime. In some aspects, the estimated runtime for the first task is further generated based on at least one of information for downloading AV assets including at least AV driving scenario data, information for downloading an executable image associated with the AV driving scenario data, or information for uploading AV artifacts in the task specification.

In some aspects, the process 1000 may further include receiving a second job request to execute at least a second task associated with at least one of a second AV simulation or a second AV code build. The second job request may include a task specification for the second task and a job completion deadline associated with the second task. Further, the scheduled at 1004 may include scheduling, using the completion time-driven scheduling model, a first worker of the one or more workers to execute the second task before the first task based on the job completion deadline associated with the second task being earlier than the job completion deadline associated with the first task, for example, as discussed above with reference to FIG. 4.

In some aspects, the scheduling at 1004 may include scheduling a first worker of the one or more workers to execute the first task based on an availability of the first worker and irrespective of the first worker having a higher capability (e.g., a higher compute resource capacity, a higher memory capacity, a higher storage capacity, and/or a higher network capacity) than a resource requirement specified by the task specification for the first task.

In some aspects, the scheduling at 1004 may include determining whether to schedule a preemptible worker or a non-preemptible worker of the one or more workers to execute the first task. The determination may be based at least in part on a runtime for the first task and a remaining time to the job completion deadline. In some aspects, the determining whether to schedule the preemptible worker or the non-preemptible worker to execute the first task may be further based on at least one of a threshold number of allowable preemptible workers (e.g., a preemptible quota), a number of committed non-preemptible workers (e.g., a committed usage or minimum usage), a threshold number of allowable non-preemptible workers (e.g., a maximum usage), a number of queued tasks including the first task, or a number of workers to execute the queued tasks (e.g., a standard fit) as discussed above with reference to FIG. 8. In some aspects, the scheduling at 1004 may further include scheduling, in response to the determining, the preemptible worker to execute the first task and further scheduling, in response to a failure to complete the first task on the preemptible worker, the non-preemptible worker to execute the first task.

Example Autonomous Vehicle

Figure 11:
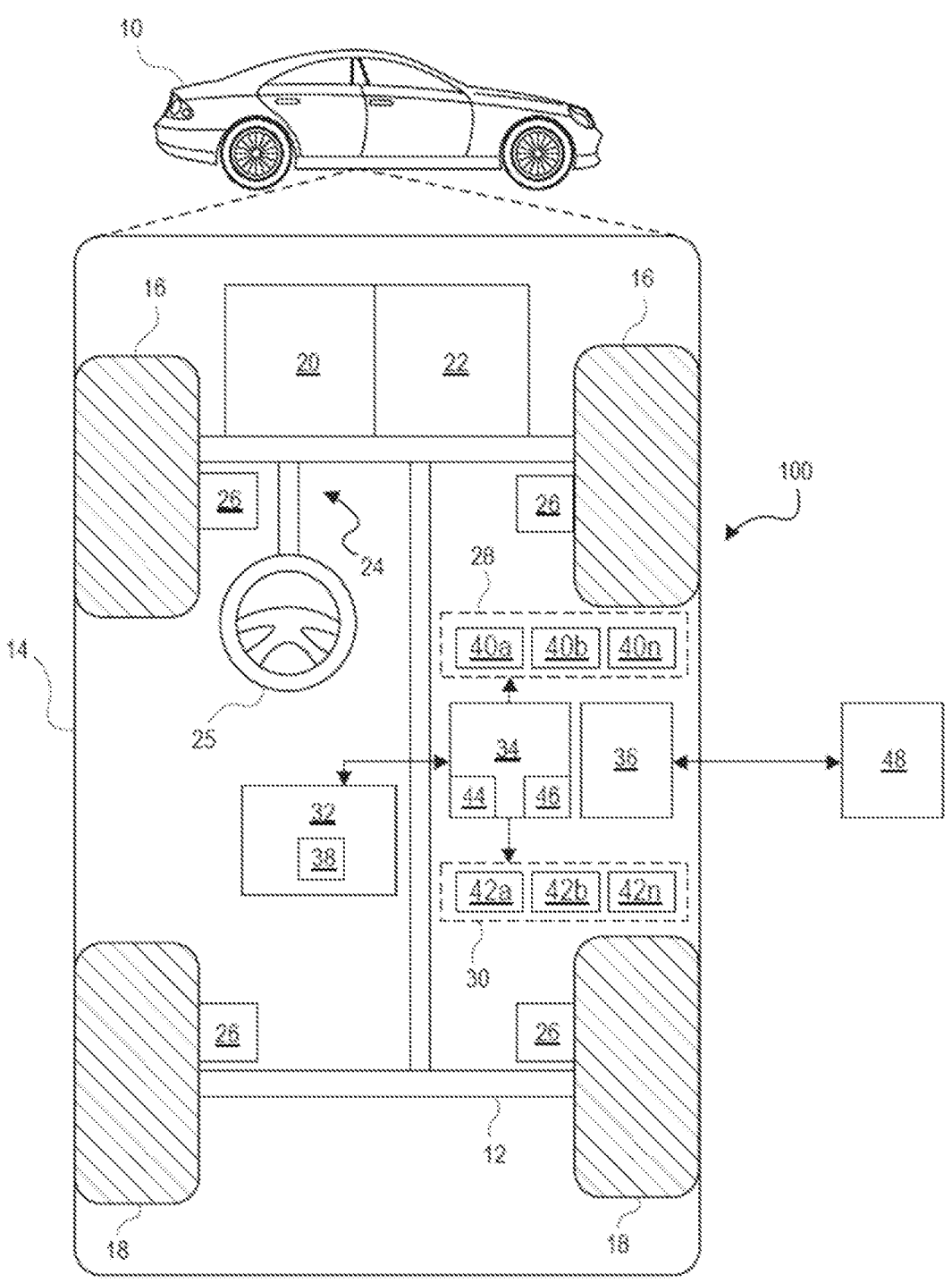
FIG. 11 illustrates an exemplary AV, according to some embodiments of the present disclosure.

FIG. 11 illustrates an exemplary AV 10, according to some embodiments of the present disclosure.

As depicted in FIG. 11, the AV 10 may generally include a chassis 12, a body 14, front wheels 16, and rear wheels 18. The body 14 may be arranged on the chassis 12 and encloses components of the AV 10. The body 14 and the chassis 12 may jointly form a frame. The front wheels 16 and rear wheels 18 may be rotationally coupled to the chassis 12 near a respective corner of the body 14. In some examples, the chassis 12 nay differ from the chassis on which the sensor arrays are mounted. For example, the sensor arrays can be mounted on the roof of the AV 10.

In various embodiments, the AV 10 may be an autonomous vehicle and the system 100 and/or components thereof may be incorporated into the AV 10. The AV 10 may be, for example, a vehicle that may be automatically controlled to carry passengers and/or cargo from one location to another. While the AV 10 may be depicted as a passenger car in FIG. 1, any other vehicle, including motorcycles, trucks, sport utility vehicles (SUVs), recreational vehicles (RVs), marine vessels, aircraft, and the like, can also be used as an autonomous vehicle.

In an example, the AV 10 may correspond to a level four or level five automation system under the Society of Automotive Engineers (SAE) "J3016" standard taxonomy of automated driving levels. Using this terminology, a level four system may indicate "high automation," referring to a driving mode in which the automated driving system performs aspects of the dynamic driving task, even if a human driver does not respond appropriately to a request to intervene. A level five system may indicate "full automation," referring to a driving mode in which the automated driving system performs aspects of the dynamic driving task under roadway and environmental conditions that can be managed by a human driver. Implementations in accordance with the present subject matter are not limited to any taxonomy or rubric of automation categories. Furthermore, systems in accordance with the present disclosure can be used in conjunction with any autonomous or other vehicle that utilizes a navigation system and/or other systems to provide route guidance.

As shown, the AV 10 may generally include a propulsion system 20, a transmission system 22, a steering system 24, a brake system 26, a sensor system 28, an actuator system 30, data storage device 32, controller 34, and a communication system 36. The propulsion system 20 can, in various embodiments, include an internal combustion engine, an electric machine such as a traction motor, and/or a fuel cell propulsion system. The transmission system 22 may be configured to transmit power from the propulsion system 20 to the front wheels 16 and rear wheels 18 according to selectable speed ratios. According to various implementations, the transmission system 22 can include a step-ratio automatic transmission, a continuously-variable transmission, or other appropriate transmission.

The brake system 26 may be configured to provide braking torque to the front wheels 16 and rear wheels 18. Brake system 26 can, in various embodiments, include friction brakes, brake by wire, a regenerative braking system such as an electric machine, and/or other appropriate braking systems.

The steering system 24 may influence a position of the front wheels 16 and/or rear wheels 18. While depicted as including a steering wheel 25 for illustrative purposes, in some embodiments contemplated within the scope of the present disclosure, the steering system 24 may not include a steering wheel.

The sensor system 28 may include one or more sensing devices 40a-40n that sense observable conditions of the exterior environment and/or the interior environment of the AV 10. The sensing devices 40a-40n can include RADAR sensors, LIDAR sensors, global positioning systems (GPSs), optical cameras, thermal cameras, time-of-flight (TOF) cameras, ultrasonic sensors, speedometers, compasses, and/or other sensors.

The actuator system 30 may include one or more actuator devices 42a-42n that control one or more vehicle features such as the propulsion system 20, the transmission system 22, the steering system 24, and the brake system 26. In various embodiments, the AV 10 can also include interior and/or exterior vehicle features not illustrated in FIG. 11, such as various doors, a trunk, and cabin features such as air conditioning, music players, lighting, touch-screen display components (such as those used in connection with navigation systems), and the like.

The data storage device 32 may store data for use in automatically controlling the AV 10. In various implementations, the data storage device 32 may store defined maps of the navigable environment. In various implementations, the defined maps may be predefined by and obtained from a remote system. For example, the defined maps may be assembled by the remote system and communicated to the AV 10 (wirelessly and/or in a wired manner) and stored in the data storage device 32. Route information can also be stored within the data storage device 32—i.e., a set of road segments (associated geographically with one or more of the defined maps) that together define a route that the user might take to travel from a start location (e.g., the user's current location) to a target location. Also, in various implementations, the data storage device 32 may store ML models 38 that are trained to facilitate autonomous driving.

In general, the data storage device 32 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any data storage devices or memory elements discussed herein should be construed as being encompassed within the broad term "memory." As will be appreciated, the data storage device 32 can be part of the controller 34, separate from the controller 34, or part of the controller 34 and part of a separate system.

The controller 34 may include a processor 44 and a computer-readable storage device or media 46. The processor 44 can be any custom-made or commercially available processor, a central processing unit (CPU), a graphics processing unit (GPU), an auxiliary processor among several processors associated with the controller 34, a semiconductor-based microprocessor (in the form of a microchip or chip set), any combination thereof, or generally any device for executing computer instructions. The computer-readable storage device or media 46 can include volatile and non-volatile storage in ROM, RAM, and keep-alive memory (KAM), for example. KAM may be a persistent or non-volatile memory that can store various operating variables while the processor 44 is powered down. The computer-readable storage device or media 46 can be implemented using any of a number of memory devices such as PROMs (programmable read-only memory), EPROMs (electrically PROM), EEPROMs (electrically erasable PROM), flash memory, or any other electric, magnetic, optical, resistive, or combination memory devices capable of storing data, some of which represent executable instructions, used by the controller 34 in controlling the AV 10. As will be appreciated, while the computer-readable storage device or media 46 is depicted in FIG. 1 as part of the controller 34, the computer-readable storage device or media 46 can be part of the data storage device 32.

The instructions can include one or more separate programs that comprise an ordered listing of executable instructions for implementing logical functions. The instructions, when executed by the processor 44, can receive and process signals from the sensor system 28, perform logic, calculations, methods and/or algorithms for automatically controlling the components of the AV 10, and generate control signals transmitted to the actuator system 30 to control the components of the AV 10 based on the logic, calculations, methods, and/or algorithms. Although one controller 34 is shown in FIG. 1, embodiments of the AV 10 can include any number of controllers 34 that communicate over any suitable communication medium or a combination of communication mediums and that cooperate to process the sensor signals, perform logic, calculations, methods, and/or algorithms, and generate control signals to control features of the AV 10.

The communication system 36 may wirelessly communicates information to and from other entities 48, such as other vehicles ("V2V" communication), infrastructure ("V2I" communication), remote transportation systems, and/or user devices. In an example, the communication system 36 may be a wireless communication system configured to communicate via a wireless local area network (WLAN) using IEEE (Institute of Electrical and Electronics Engineers) 802.11 standards or by using cellular data communication (e.g., fifth-generation (5G) under the third Generation Partnership Project (3GPP)). Additional or alternate communication methods, such as a dedicated short-range communications (DSRC) channel, may also considered within the scope of the present disclosure. DSRC channels may refer to one-way or two-way short-range to medium-range wireless communication channels specifically designed for automotive use and a corresponding set of protocols and standards.

Example Computing System

Figure 12:
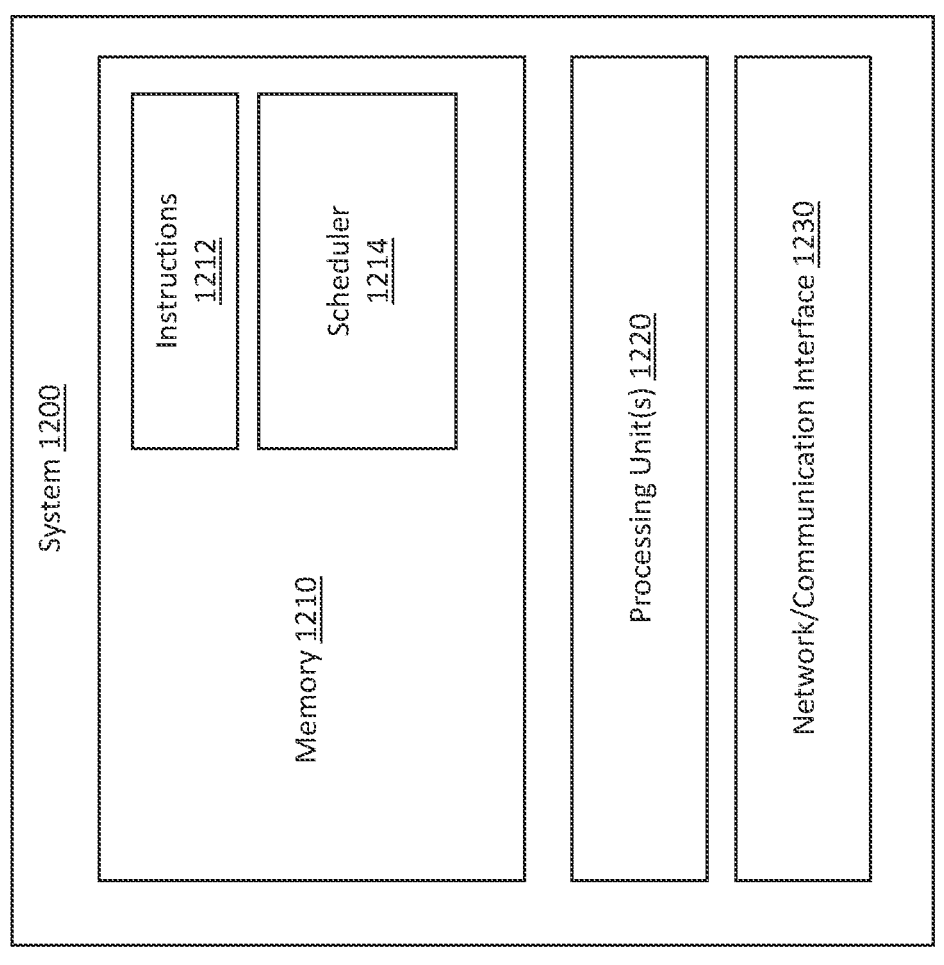
FIG. 12 illustrates an exemplary computing system used in various embodiments of the present disclosure.

FIG. 12 illustrates components of a computing system 1200 used in implementations described herein. In some embodiments, the components of FIG. 12 can be present in a vehicle or an AV (e.g., the AV 10). In other embodiments, the components of FIG. 12 can be present in an infrastructure system for AV.

Referring to FIG. 12, system 1200 can be implemented within one computing device or distributed across multiple computing devices or sub-systems that cooperate in executing program instructions. In some implementations, the system 1200 can include one or more blade server devices, standalone server devices, personal computers, routers, hubs, switches, bridges, firewall devices, intrusion detection devices, mainframe computers, network-attached storage devices, smartphones and other mobile telephones, and other computing devices. The system hardware can be configured according to any suitable computer architectures such as a Symmetric Multi-Processing (SMP) architecture or a Non-Uniform Memory Access (NUMA) architecture.

The system 1200 can include one or more processing units 1220, which can include one or more hardware processors and/or other circuitry that retrieves and executes instructions 1212 (e.g., software or firmware codes) from memory 1210. The one or more processing units 1220 can be implemented within one processing device, chip, or package and can also be distributed across multiple processing devices, chips, packages, or sub-systems that cooperate in executing program instructions. In one implementation, the one or more processing units 1220 may include a CPU and a GPU. The GPU can execute the visual/image processing in the computing system. The GPU, or any second-order processing element independent from CPU dedicated to processing imagery and other perception data in real or near real-time, can provide a significant benefit.

The memory 1210 can include any computer-readable storage media readable by one or more processing unit(s) 1220 and that stores instructions 1212 and a scheduler 1214. The memory 1210 can be implemented as one storage device and can also be implemented across multiple co-located or distributed storage devices or sub-systems. The memory 1210 can include additional elements, such as a controller, that communicate with the one or more processing units 1220. The memory 1210 can also include storage devices and/or sub-systems on which data and/or instructions may be stored. System 1200 can access one or more storage resources to access information to carry out any of the processes indicated by instructions 1212.

The instructions 1212, including routines for at least partially performing at least one of the processes illustrated in FIGS. 2-10, can be implemented in program instructions. Further, the instructions 1212, when executed by system 1200 in general or the one or more processing unit(s) 1220 in particular, can direct, among other functions, the system 1200 or the one or more processing units 1220 to operate as described herein.

The scheduler 1214 may schedule execution of tasks related to AV simulation and/or AV code build as discussed above. In an aspect, the scheduler 1214 may implement the functionalities of a scheduler 230, for example, to utilize a completion time-driven scheduling model with ML and resource-aware pipeline scheduling discussed above with reference to FIGS. 4, 7-8, and 10. In some aspects, the scheduler 1214 may implement the functionalities of a worker 332, for example, to partition tasks into multiple stages (e.g., including an AV asset download stage, followed by an AV code execution stage and a subsequent AV artifact upload stage) and performing different stages of multiple tasks concurrently based on different resource requirements associated with the different stages as discussed above with reference to FIGS. 5-6 and 9.

In implementations where the system 1200 may include multiple computing devices, the server can use one or more communications networks that facilitate communication among the computing devices. For example, the one or more communications networks can include or be a local or wide area network that facilitates communication among the computing devices. One or more direct communication links can be included between the computing devices. In addition, the computing devices can be installed at geographically distributed locations or at one geographic location, such as a server farm or an office.

System 1200 can include a communications interface 1230 that provides one or more communication connections and/or one or more devices that allow for communication between system 1200 and other computing systems (not shown) over a communication network or collection of networks (not shown) or the air.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

SELECTED EXAMPLES

Example 1 is a method including receiving, by a computer-implemented system, a first task specification for a first task associated with at least one of a first autonomous vehicle (AV) simulation or a first AV code build; receiving, by the computer-implemented system, a second task specification for a second task associated with at least one of a second AV simulation or a second AV code build; and executing, by the computer-implemented system, a portion of the first task concurrently with a portion of the second task based at least in part on the portion of the first task and the portion of the second task have different resource requirements, where the portion of the first task is associated with one of an AV asset download, an AV code execution, or an AV artifact upload, and where the portion of the second task is associated with a different one of the AV asset download, the AV code execution, or the AV artifact upload.

In Example 2, the subject matter of Example 1 can optionally include where the portion of the first task executed concurrently with the portion of the second task is associated with the AV asset download; and the portion of the second task is associated with the AV artifact upload.

In Example 3, the subject matter of any of Examples 1-2 can optionally include where the AV asset download includes downloading AV driving scenario including at least one of objects associated with an AV driving scenario; or ground truth data associated with a machine learning (ML) model trained for the AV driving scenario.

In Example 4, the subject matter of any of Examples 1-3 can optionally include where the AV artifact upload includes uploading at least one of an AV driving score associated with an AV driving scenario; an AV simulation log associated with the AV driving scenario; or a machine learning model prediction associated with the AV driving scenario.

In Example 5, the subject matter of any of Examples 1-4 can optionally include where the executing the portion of the first task concurrently with the portion of the second task is further based on the portion of the first task and the portion of the second task having at least one of different compute resource requirements; different memory resource requirements; different storage resource requirements; or different network resource requirements.

In Example 6, the subject matter of any of Examples 1-5 can optionally include executing, by the computer-implemented system, another portion of the first task concurrently with a portion of a third task associated with at least one of a third AV simulation or a third AV code build, where the third task is different from the second task.

In Example 7, the subject matter of any of Examples 1-6 can optionally include receiving, by the computer-implemented system, a job request to execute one or more tasks including the first task, where the job request includes the first task specification specifying information for downloading AV driving scenario data for the first task and information for uploading AV artifacts associated with the first task.

Example 8 is a method including receiving, by a computer-implemented system, a first job request to execute one or more tasks associated with at least one of a first autonomous vehicle (AV) simulation or a first AV code build, the first job request including a task specification specifying AV driving scenario data for a first task of the one or more tasks; and a job completion deadline associated with the one or more tasks; scheduling, by the computer-implemented system using a completion time-driven scheduling model, one or more workers to execute the first task within the job completion deadline; and transmitting, by the computer-implemented system, to the one or more workers, the task specification.

In Example 9, the subject matter of Example 8 can optionally include where the completion time-driven scheduling model includes a task runtime model trained on task runtime data associated with at least one of a second AV simulation or a second AV code build different from the at least one of the first AV simulation or the first AV code build.

In Example 10, the subject matter of any of Examples 8-9 can optionally include receiving, by the computer-implemented system, a completion indication for the first task; and updating the task runtime model based on a task runtime and the task specification for the first task, where the task runtime is based at least in part on the completion indication.

In Example 11, the subject matter of any of Examples 8-10 can optionally include where the scheduling includes generating, using the task runtime model, an estimated runtime for the first task based on the task specification; and calculating an estimated job completion time based at least in part on the estimated runtime.

In Example 12, the subject matter of any of Examples 8-11 can optionally include where the generating the estimated runtime for the first task is further based on the task specification including at least one of information for downloading AV assets including at least AV driving scenario data; information for downloading an executable image associated with the AV driving scenario data; or information for uploading AV artifacts.

In Example 13, the subject matter of any of Examples 8-12 can optionally include receiving a second job request to execute at least a second task associated with at least one of a second AV simulation or a second AV code build, the second job request including a task specification for the second task; and a job completion deadline associated with the second task, where the scheduling includes scheduling, using the completion time-driven scheduling model, a first worker of the one or more workers to execute the second task before the first task based on the job completion deadline associated with the second task being earlier than the job completion deadline associated with the first task.

In Example 14, the subject matter of any of Examples 8-13 can optionally include where the scheduling includes determining, based at least in part on a runtime for the first task and a remaining time to the job completion deadline, whether to schedule a preemptible worker or a non-preemptible worker of the one or more workers to execute the first task.

In Example 15, the subject matter of any of Examples 8-14 can optionally include where the determining whether to schedule the preemptible worker or the non-preemptible worker to execute the first task is further based on at least one of a threshold number of allowable preemptible workers; a number of committed non-preemptible workers; a threshold number of allowable non-preemptible workers; a number of scheduled non-preemptible workers; a number of queued tasks including the first task; or a number of workers to execute the queued tasks.

In Example 16, the subject matter of any of Examples 8-15 can optionally include where the scheduling the one or more workers further includes scheduling, in response to the determining, the preemptible worker to execute the first task; and scheduling, in response to a failure to complete the first task on the preemptible worker, the non-preemptible worker to execute the first task.

Example 17 is one or more non-transitory, computer-readable media encoded with instructions that, when executed by one or more processing units, perform a method including receiving a first task specification for a first task associated with at least one of a first autonomous vehicle (AV) simulation or a first AV code build; receiving, a second task specification for a second task associated with at least one of a second AV simulation or a second AV code build; and executing a portion of the first task concurrently with a portion of the second task based on the portion of the first task and the portion of the second task having different resource requirements, where the portion of the first task is associated with one of an AV asset download, an AV code execution, or an AV artifact upload, and where the portion of the second task is associated with a different one of the AV asset download, the AV code execution, or the AV artifact upload.

In Example 18, the subject matter of Example 17 can optionally include where the portion of the first task executed concurrently with the portion of the second task is associated with the AV asset download; and the portion of the second task is associated with the AV artifact upload.

In Example 19, the subject matter of any of Examples 17-18 can optionally include where the portion of the first task executed concurrently with the portion of the second task is further based on the portion of the first task and the portion of the second task having at least one of different compute resource requirements; different memory resource requirements; different storage resource requirements; or different network resource requirements.

In Example 20, the one or more non-transitory, computer-readable media of any of Examples 17-19 can optionally include the method further including receiving a job request to execute one or more tasks including the first task, where the job request includes a task specification specifying information for downloading AV driving scenario data for the first task and information for uploading AV artifacts associated with the first task.

Example 21 is one or more non-transitory, computer-readable media encoded with instructions that, when executed by one or more processing units, perform the method of any of Examples 8-16.

Example 22 is a computer implemented system including one or more processing units and one or more non-transitory computer-readable media storing instructions, when executed by the one or more processing units, cause the one or more processing units to perform the method of any of Examples 1-7.

Example 23 is a computer implemented system including one or more processing units and one or more non-transitory computer-readable media storing instructions, when executed by the one or more processing units, cause the one or more processing units to perform the method of any of Examples 8-16.

Variations and Implementations

As will be appreciated by one skilled in the art, aspects of the present disclosure, in particular, aspects of using a completion time-driven scheduling model with ML and/or resource-aware pipeline scheduling, described herein, can be embodied in various manners (e.g., as a method, a system, a computer program product, or a computer-readable storage medium). Accordingly, aspects of the present disclosure can take the form of a hardware implementation, a software implementation (including firmware, resident software, or micro-code) or an implementation combining software and hardware aspects that can generally be referred to herein as a "circuit," "module" or "system." Functions described in this disclosure can be implemented as an algorithm executed by one or more hardware processing units, e.g. one or more microprocessors of one or more computers. In various embodiments, different steps and portions of the operations of the methods described herein can be performed by different processing units. Furthermore, aspects of the present disclosure can take the form of a computer program product embodied in one or more computer-readable media having computer-readable program code embodied, e.g., stored or encoded, thereon. In various embodiments, such a computer program can, for example, be downloaded (or updated) to the existing devices and systems or be stored upon manufacturing of these devices and systems.

The foregoing disclosure presents various descriptions of certain specific embodiments. The innovations described herein can be embodied in a multitude of different ways, for example, as defined and covered by the claims and/or select examples. In the following description, reference is made to the drawings where like reference numerals can indicate identical or functionally similar elements. Elements illustrated in the drawings are not necessarily drawn to scale. Additionally, certain embodiments can include more elements than illustrated in a drawing and/or a subset of the elements illustrated in a drawing. Further, some embodiments can incorporate any suitable combination of features from two or more drawings.

The foregoing disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting. Numerous implementation-specific decisions might be made to achieve the developer's specific goals, including compliance with system, business, and/or legal constraints, which may vary from one implementation to another. Additionally, while such a development effort might be complex and time-consuming; it would be a routine undertaking for those of ordinary skill in the art having the benefit of this disclosure.

In the Specification, reference might be made to spatial relationships between various components and to the spatial orientation of various aspects of components as depicted in the attached drawings. As will be recognized by those skilled in the art after a complete reading of the present disclosure, the devices, components, members, and apparatuses described herein can be positioned in any orientation. Thus, the use of terms such as "above", "below", "upper", "lower", "top", "bottom", or other similar terms to describe a spatial relationship between various components or to describe the spatial orientation of aspects of such components, describe a relative relationship between the components or a spatial orientation of aspects of such components, respectively, as the components described herein can be oriented in any direction. When used to describe a range of dimensions or other characteristics (e.g., time, pressure, temperature, length, width, etc.) of an element, operations, and/or conditions, the phrase "between X and Y" represents a range that includes X and Y.

Other features and advantages of the disclosure will be apparent from the description and the claims. Note that all optional features of the apparatus described above may also be implemented with respect to the method or process described herein and specifics in the examples may be used anywhere in one or more embodiments.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

In addition, the terms "storage media," "computer-readable storage media," or "computer-readable storage medium" can refer to non-transitory storage media, such as a hard drive, a memory chip, and cache memory, and to transitory storage media, such as carrier waves or propagating signals.

Further, the terms "comprise," "comprising," "include," "including," "have," "having" or any other variation thereof, are intended to cover a non-exclusive inclusion. For example, a method, process, device, or system that comprises a list of elements is not necessarily limited to only those elements but may include other elements not expressly listed or inherent to such method, process, device, or system. Also, the term "or" refers to an inclusive or and not to an exclusive or.

In one example embodiment, any number of electrical circuits of the FIGS. can be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.) and computer-readable, non-transitory memory elements can be coupled to the board based on particular configurations, processing demands, or computer designs. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

It is also imperative to note that all of the specifications, dimensions, and relationships outlined herein (e.g., the number of processors, logic operations, etc.) have been offered for purposes of example and teaching. Such information can be varied considerably, as the specifications apply to non-limiting examples. In the foregoing description, example implementations have been described with reference to particular arrangements of components. Various modifications and changes can be made to such implementations. The description and drawings are, accordingly, to be regarded in an illustrative sense and not in a restrictive sense.

With the numerous examples provided herein, interaction may be described in terms of two, three, four, or more electrical components for purposes of clarity and example. The system can be consolidated in any suitable manner. Along similar design alternatives, any of the illustrated components, modules, and elements of the FIGS. can be combined in various possible configurations within the scope of this disclosure. In certain cases, it might be easier to describe one or more of the functionalities of a given set of flows by referencing a limited number of electrical elements. The electrical circuits of the FIGS. and their teachings are readily scalable and can accommodate many components, as well as more complicated/sophisticated arrangements and configurations. Accordingly, the examples provided do not limit the scope or inhibit the teachings of the electrical circuits as potentially applied to a myriad of other architectures.

Note that in this Specification, references to various features (e.g., elements, structures, modules, components, steps, operations, characteristics, etc.) included in "one implementation", "example implementation", "an implementation", "another implementation", "some implementations", "various implementations", "other implementations", "alternative implementation", and the like are intended to mean that any such features are included in one or more implementations of the present disclosure and might not necessarily be combined in the same embodiments.

Note that the functions related to using a completion time-driven scheduling model with ML and/or resource-aware pipeline scheduling, e.g., those summarized in the one or more processes shown in FIGS., illustrate some of the possible functions that can be executed by, or within, the systems illustrated in the FIGS. Some of these operations can be deleted or omitted where appropriate, or these operations can be modified or changed considerably. In addition, the timing of these operations can be altered considerably. The preceding operational flows have been offered for purposes of example and discussion. Implementations described herein provide flexibility, in that any suitable arrangements, chronologies, configurations, and timing mechanisms can be provided.

Numerous other changes, substitutions, variations, alterations, and modifications might be ascertained by one skilled in the art, and the present disclosure encompasses such changes, substitutions, variations, alterations, and modifications as falling within the scope of the appended claims. Optional features of the apparatus described above can be implemented with respect to the method or process described herein and specifics in the examples can be used anywhere in one or more embodiments.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph (f) of 35 U.S.C. Section 112 as it exists on the date of the filing hereof unless the words "means for" or "step for" are specifically used in the particular claims; and (b) does not intend, by any statement in the Specification, to limit this disclosure in any way that is not otherwise reflected in the appended claims.

What is claimed is:

1. A method comprising:

receiving, by a computer-implemented system, a first task specification for a first task associated with at least one of a first autonomous vehicle (AV) simulation or a first AV code build;

receiving, by the computer-implemented system, a second task specification for a second task associated with at least one of a second AV simulation or a second AV code build;

executing, by the computer-implemented system, a portion of the first task concurrently with a portion of the second task based at least in part on the portion of the first task and the portion of the second task have different resource requirements, wherein the portion of the first task is associated with one of an AV asset download, an AV code execution, or an AV artifact upload, and wherein the portion of the second task is associated with a different one of the AV asset download, the AV code execution, or the AV artifact upload; and receiving, by the computer-implemented system, a job request to execute a set number of tasks including the first task, wherein the job request includes the first task specification and a job completion deadline, wherein the first task specification specifies information for downloading AV driving scenario data for the first task and information for uploading AV artifacts associated with the first task, and wherein the job completion deadline specifies a time by which all of the set number of tasks of the job request are to be completed.

2. The method of claim 1, wherein the AV asset download includes downloading an AV driving scenario including at least one of:

objects associated with the AV driving scenario; or ground truth data associated with a machine learning (ML) model trained for the AV driving scenario.

3. The method of claim 1, wherein the AV artifact upload includes uploading at least one of:

an AV driving score associated with an AV driving scenario;

an AV simulation log associated with the AV driving scenario; or a machine learning model prediction associated with the AV driving scenario.

4. The method of claim 1, wherein:

the portion of the first task executed concurrently with the portion of the second task is associated with the AV asset download; and the portion of the second task is associated with the AV artifact upload.

5. The method of claim 1, wherein the executing the portion of the first task concurrently with the portion of the second task is further based on the portion of the first task and the portion of the second task having requirements for a different number of processing cores.

6. The method of claim 1, wherein the executing the portion of the first task concurrently with the portion of the second task is further based on the portion of the first task and the portion of the second task having requirements for a different amount of memory.

7. The method of claim 1, wherein the executing the portion of the first task concurrently with the portion of the second task is further based on the portion of the first task and the portion of the second task having requirements for a different amount of disk storage devices.

8. The method of claim 1, wherein the executing the portion of the first task concurrently with the portion of the second task is further based on the portion of the first task and the portion of the second task having requirements for a different amount of network bandwidth and throughput.

9. The method of claim 1, further comprising:

executing, by the computer-implemented system, another portion of the first task concurrently with a portion of a third task associated with at least one of a third AV simulation or a third AV code build, wherein the third task is different from the second task.

10. One or more non-transitory, computer-readable media encoded with instructions that, when executed by one or more processing units, perform a method comprising:

receiving a first task specification for a first task associated with at least one of a first autonomous vehicle (AV) simulation or a first AV code build;

receiving, a second task specification for a second task associated with at least one of a second AV simulation or a second AV code build; and executing a portion of the first task concurrently with a portion of the second task based on the portion of the first task and the portion of the second task having different resource requirements, wherein the portion of the first task is associated with one of an AV asset download, an AV code execution, or an AV artifact upload, and wherein the portion of the second task is associated with a different one of the AV asset download, the AV code execution, or the AV artifact upload, wherein the portion of the first task executed concurrently with the portion of the second task is further based on the portion of the first task and the portion of the second task having at least one of:

requirements for a different number of processing cores;

requirements for a different amount of memory;

requirements for a different amount of disk storage; or requirements for a different amount of network bandwidth and throughput.

11. The one or more non-transitory, computer-readable media of claim 10, wherein:

the portion of the first task executed concurrently with the portion of the second task is associated with the AV asset download; and the portion of the second task is associated with the AV artifact upload.

12. The one or more non-transitory, computer-readable media of claim 10, the method further comprising:

executing another portion of the first task concurrently with a portion of a third task associated with at least one of a third AV simulation or a third AV code build, wherein the third task is different from the second task.

13. The one or more non-transitory, computer-readable media of claim 10, the method further comprising:

receiving a job request to execute one or more tasks including the first task, wherein the job request includes the first task specification specifying information for downloading AV driving scenario data for the first task and information for uploading AV artifacts associated with the first task.

14. A computer-implemented system comprising:

one or more processing units; and one or more non-transitory computer-readable media storing instructions, when executed by the one or more processing units, cause the one or more processing units to perform operations comprising:

receiving a first task specification for a first task associated with at least one of a first autonomous vehicle (AV) simulation or a first AV code build;

receiving, a second task specification for a second task associated with at least one of a second AV simulation or a second AV code build; and executing a portion of the first task concurrently with a portion of the second task based on the portion of the first task and the portion of the second task having different resource requirements, wherein the portion of the first task is associated with one of an AV asset download, an AV code execution, or an AV artifact upload, and wherein the portion of the second task is associated with a different one of the AV asset download, the AV code execution, or the AV artifact upload, wherein the portion of the first task executed concurrently with the portion of the second task is further based on the portion of the first task and the portion of the second task having:

requirements for a different number of processing cores;

requirements for a different amount of memory;

requirements for a different amount of disk storage; and requirements for a different amount of network bandwidth and throughput.

15. The computer-implemented system of claim 14, wherein:

the portion of the first task executed concurrently with the portion of the second task is associated with the AV asset download; and the portion of the second task is associated with the AV artifact upload.

16. The computer-implemented system of claim 14, the operations further comprising:

executing another portion of the first task concurrently with a portion of a third task associated with at least one of a third AV simulation or a third AV code build, wherein the third task is different from the second task.

17. The computer-implemented system of claim 14, the operations further comprising:

receiving a job request to execute one or more tasks including the first task, wherein the job request includes the first task specification specifying:

information for downloading AV driving scenario data for the first task; and information for uploading AV artifacts associated with the first task.

* * * * *